US009331061B2

(12) United States Patent
De Rooij et al.

(10) Patent No.: US 9,331,061 B2
(45) Date of Patent: May 3, 2016

(54) PARALLEL CONNECTION METHODS FOR HIGH PERFORMANCE TRANSISTORS

(75) Inventors: Michael A. De Rooij, Palm Springs, CA (US); Johan Strydom, Santa Clara, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 805 days.

(21) Appl. No.: 13/596,962

(22) Filed: Aug. 28, 2012

(65) Prior Publication Data

US 2013/0049814 A1 Feb. 28, 2013

Related U.S. Application Data

(60) Provisional application No. 61/528,358, filed on Aug. 29, 2011.

(51) Int. Cl.

| H03K 17/12 | (2006.01) |
|---|---|
| H01L 27/02 | (2006.01) |
| H01L 27/082 | (2006.01) |
| H01L 27/085 | (2006.01) |

(52) U.S. Cl.
CPC ........... *H01L 27/0207* (2013.01); *H01L 27/082* (2013.01); *H01L 27/085* (2013.01); *H03K 17/122* (2013.01)

(58) Field of Classification Search
CPC .... H03K 17/122; H03K 17/12; H03K 17/168
See application file for complete search history.

(56) References Cited

U.S. PATENT DOCUMENTS

| 4,567,379 A | * | 1/1986 | Corey et al. .................. 327/108 |
|---|---|---|---|
| 4,584,595 A | * | 4/1986 | Kammiller .................... 257/365 |
| 4,966,867 A | * | 10/1990 | Crotti et al. ................... 438/701 |
| 5,057,719 A | * | 10/1991 | Niedra .......................... 327/404 |
| 5,166,541 A | * | 11/1992 | Mori ............................. 327/443 |
| 5,508,652 A | * | 4/1996 | Jekel ............................. 327/427 |
| 5,616,945 A | * | 4/1997 | Williams ...................... 257/365 |
| 5,637,899 A | * | 6/1997 | Eimori et al. ................. 257/347 |
| 5,804,859 A | * | 9/1998 | Takahashi et al. ............ 257/355 |
| 5,903,067 A | * | 5/1999 | Sato et al. ..................... 307/113 |
| 6,011,419 A |  | 1/2000 | Nowak et al. |
| 6,259,118 B1 |  | 7/2001 | Kadosh et al. |
| 6,462,620 B1 | * | 10/2002 | Dupuis .................. H01L 27/08 257/E27.046 |
| 6,479,865 B1 | * | 11/2002 | Lee et al. ...................... 257/347 |
| 6,515,531 B2 | * | 2/2003 | Ruff et al. ..................... 327/310 |
| 6,583,976 B1 | * | 6/2003 | Murahashi et al. .......... 361/100 |
| 6,597,200 B2 | * | 7/2003 | Pfeiffer et al. ................. 326/83 |
| 7,009,263 B2 | * | 3/2006 | Enders ................ H01L 29/1033 257/327 |
| 7,183,594 B2 | * | 2/2007 | Hartwig ........................ 257/204 |

(Continued)

OTHER PUBLICATIONS

A. Elbanhawy, "AN-7019 Limiting Cross-Conduction Current in Synchronous Buck Converter Designs," *Fairchild Semiconductor*, pp. 1-7, Rev. A. Sep. 30, 1995.

(Continued)

*Primary Examiner* — Thomas J Hiltunen
(74) *Attorney, Agent, or Firm* — Blank Rome LLP

(57) ABSTRACT

Parallel transistor circuits with reduced effects from common source induction. The parallel transistors include physical gate connections that are located electrically close to one another. The parallel circuits are arranged such that the voltage at the common gate connection resulting from transient currents across common source inductance is substantially balanced. The circuits include switching circuits, converters, and RF amplifiers.

46 Claims, 36 Drawing Sheets

(56) References Cited

U.S. PATENT DOCUMENTS

| | | | |
|---|---|---|---|
| 7,330,046 B2 | 2/2008 | Duerbaum | |
| 7,521,985 B2* | 4/2009 | Ball et al. | 327/512 |
| 7,547,992 B2* | 6/2009 | Hiyama | 307/113 |
| 7,579,900 B2* | 8/2009 | Durbaum | 327/513 |
| 7,589,400 B2* | 9/2009 | Hozoji et al. | 257/673 |
| 7,650,132 B2* | 1/2010 | Darabi | 455/333 |
| 7,671,639 B2* | 3/2010 | Schlapbach et al. | 327/110 |
| 7,737,650 B2* | 6/2010 | Sardat | 318/400.26 |
| 8,040,652 B2* | 10/2011 | Forghani-zadeh et al. | 361/93.9 |
| 8,217,469 B2* | 7/2012 | Hou et al. | 257/401 |
| 8,283,963 B2* | 10/2012 | Lueders et al. | 327/318 |
| 8,351,231 B2* | 1/2013 | Tagome | 363/71 |
| 8,519,686 B2* | 8/2013 | Rozman et al. | 323/282 |
| 8,681,275 B2* | 3/2014 | Kamishinbara et al. | 348/720 |
| 8,847,656 B1* | 9/2014 | A et al. | 327/310 |
| 2005/0179096 A1 | 8/2005 | Beach et al. | |
| 2009/0109590 A1* | 4/2009 | Girot et al. | 361/93.8 |
| 2010/0002351 A1* | 1/2010 | Ablabutyan | 361/211 |
| 2010/0109015 A1* | 5/2010 | Ueno | 257/76 |
| 2010/0258843 A1 | 10/2010 | Lidow et al. | |
| 2010/0258912 A1 | 10/2010 | Beach et al. | |
| 2011/0042750 A1* | 2/2011 | Chuang et al. | 257/368 |
| 2012/0119305 A1* | 5/2012 | Chen et al. | 257/401 |
| 2012/0154956 A1* | 6/2012 | Vashchenko et al. | 361/1 |
| 2012/0313184 A1* | 12/2012 | Kanie et al. | 257/379 |
| 2013/0300492 A1* | 11/2013 | Zhao et al. | 327/434 |
| 2014/0028375 A1* | 1/2014 | Komiya et al. | 327/427 |
| 2014/0159630 A1* | 6/2014 | Muhlbauer | 318/400.27 |

OTHER PUBLICATIONS

J. Dodge, "Eliminating Parasitic Oscillation between Parallel MOSFETs," *Advanced Power Technology*, APT-0402 Rev A, Mar. 25, 2004.

J. B. Forsythe, "Paralleling of Power MOSFETs for Higher Power Output," *International Rectifier*.

H. Granberg, "Get 600 Watts RF From Four Power FETs," *Motorola Semiconductor Engineering Bulletin*, pp. 1-9, 1993.

R. Frey, "Paralleling MOSFETs in RF Amplifiers," www.microsemi.com, Microsemi Power Products Group, Application Note 1814, Oct. 2010.

H. Granberg, "Get 600 Watts RF From Four Power FETs," *Engineering Bulletin*, EB104, Motorola, Inc. 1983.

\* cited by examiner

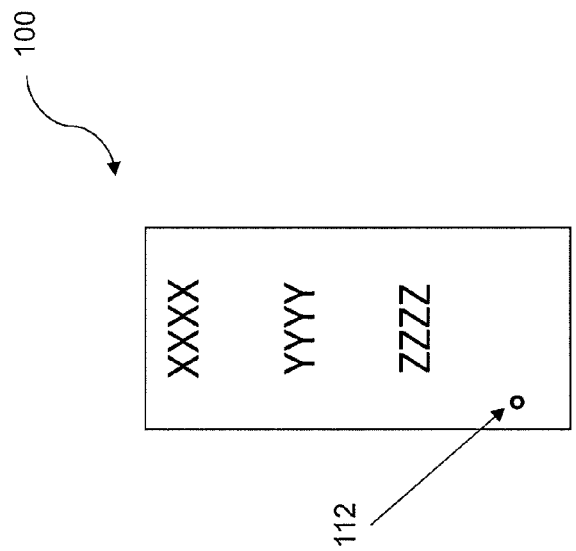

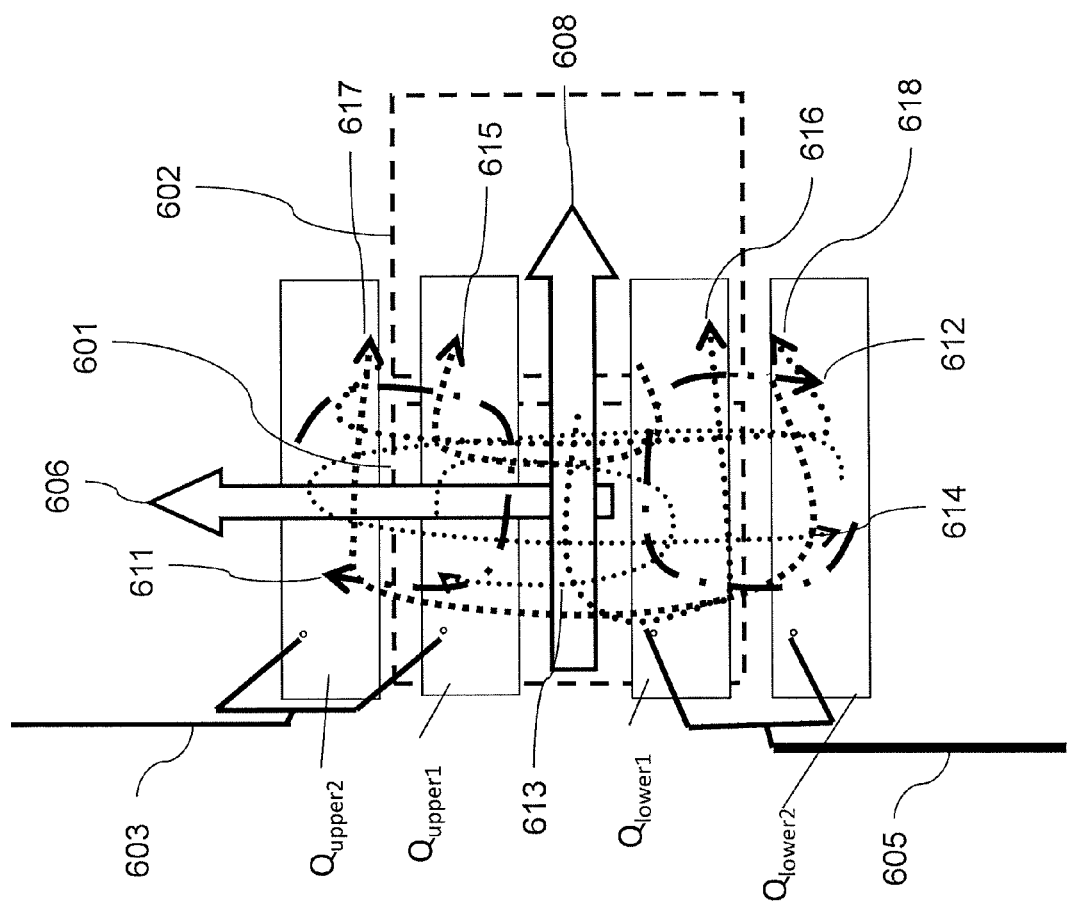

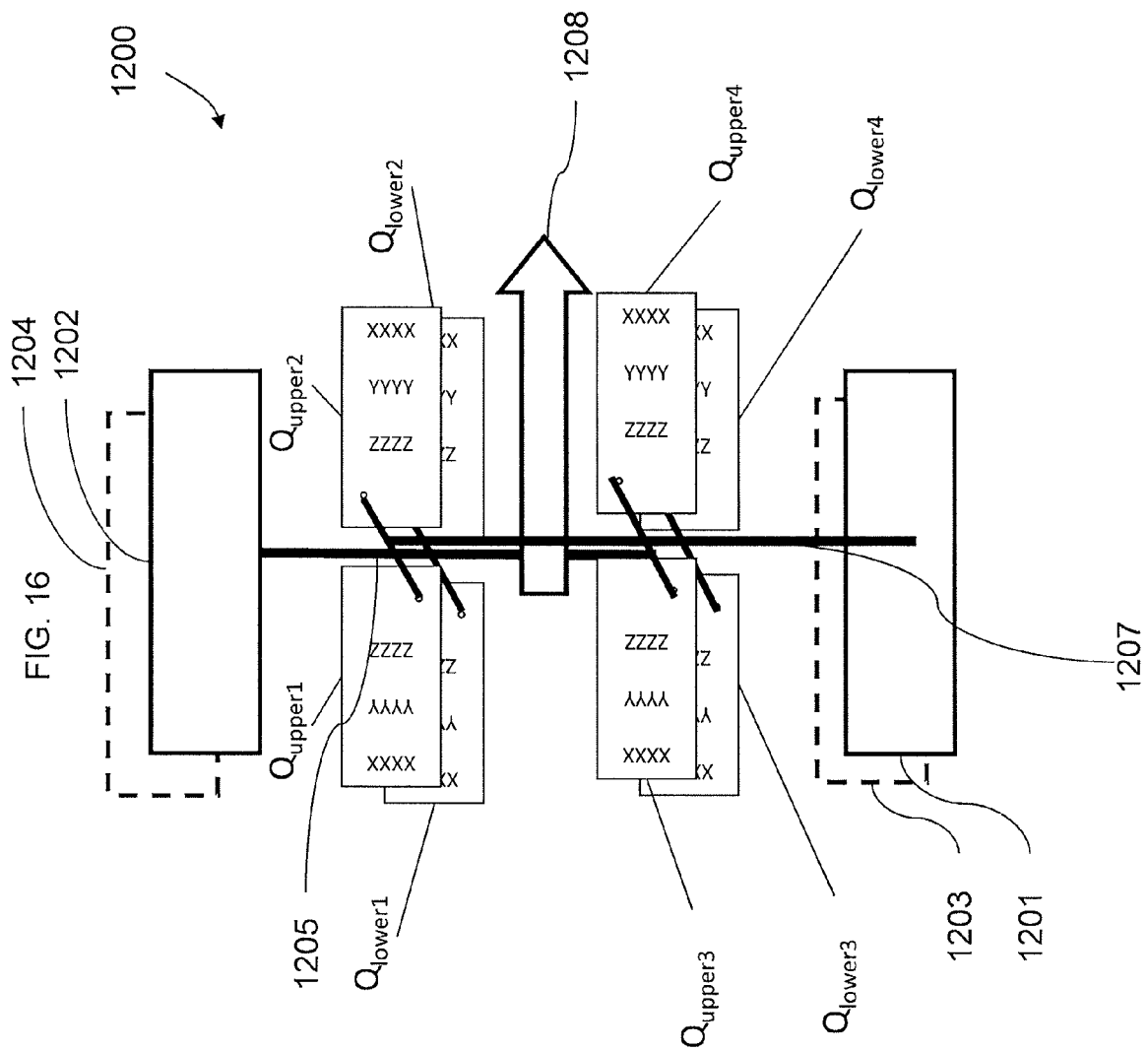

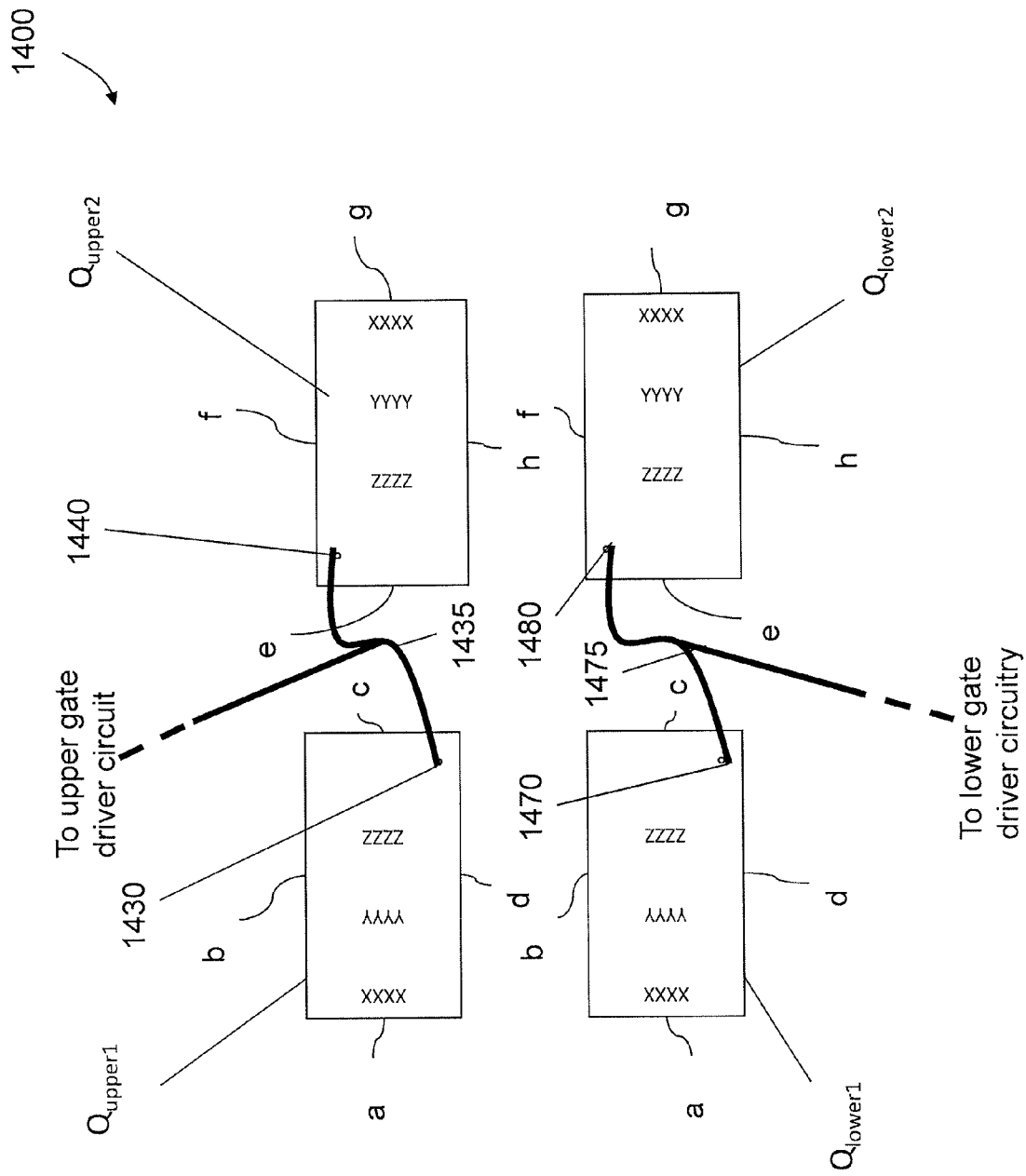

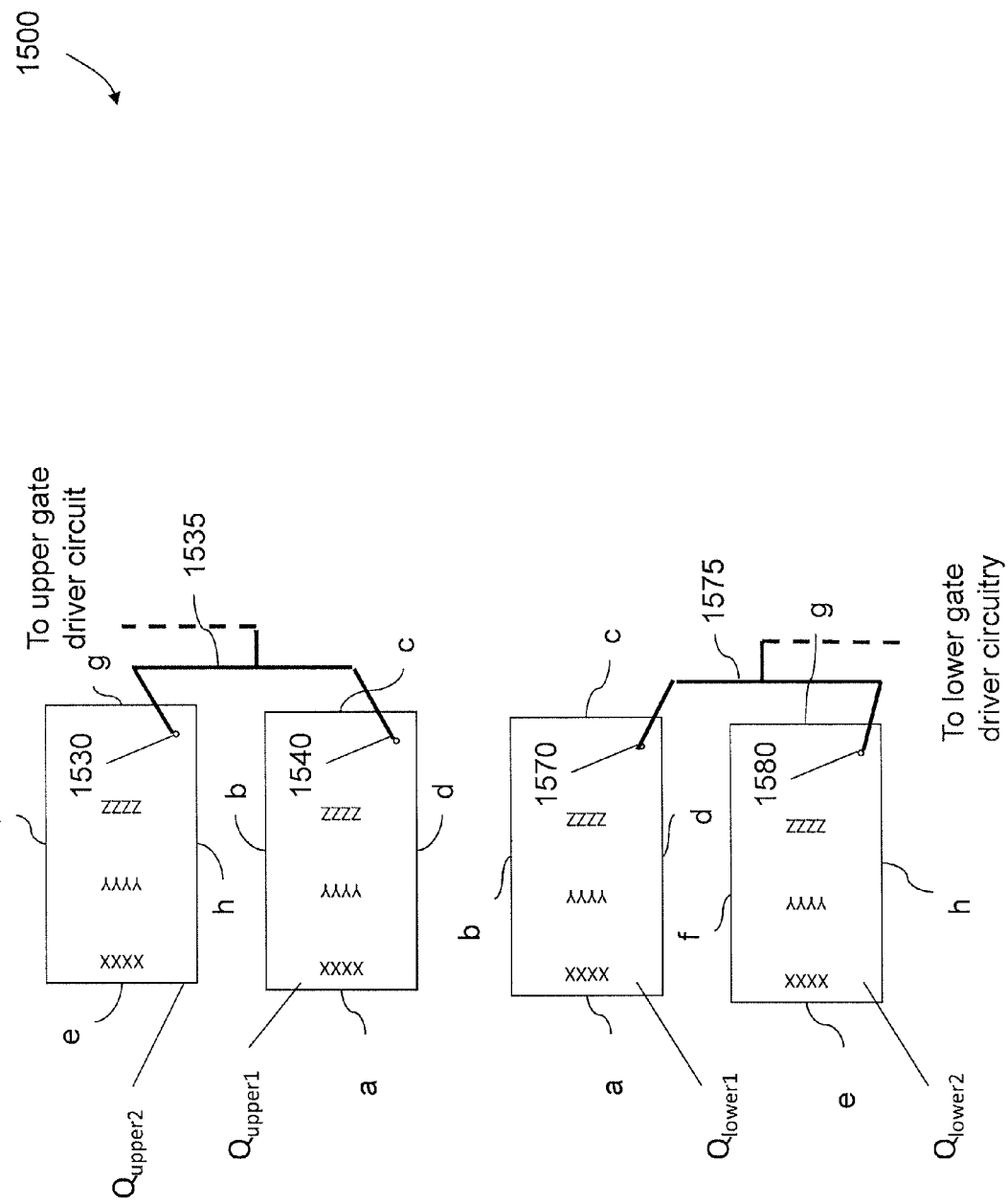

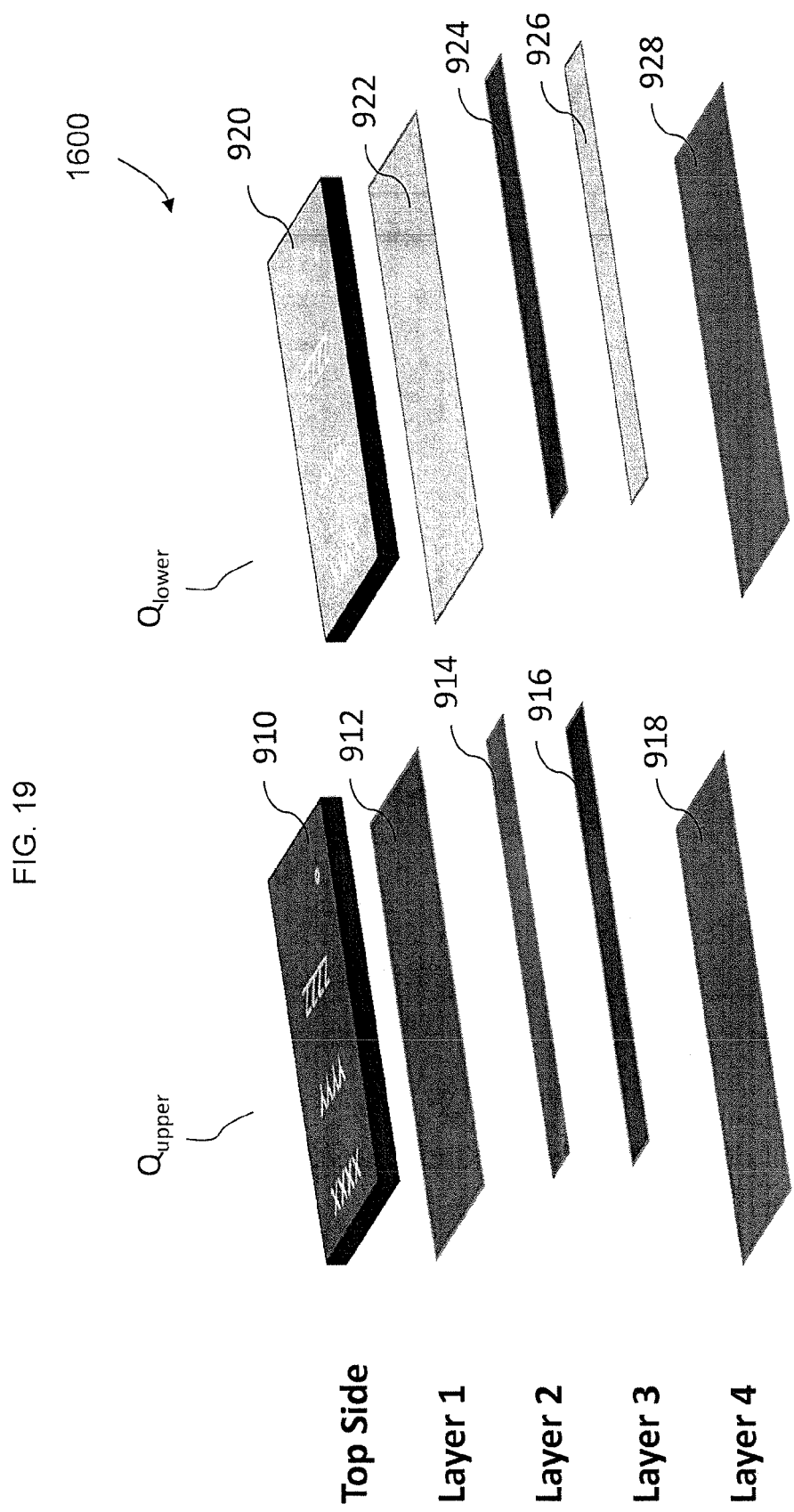

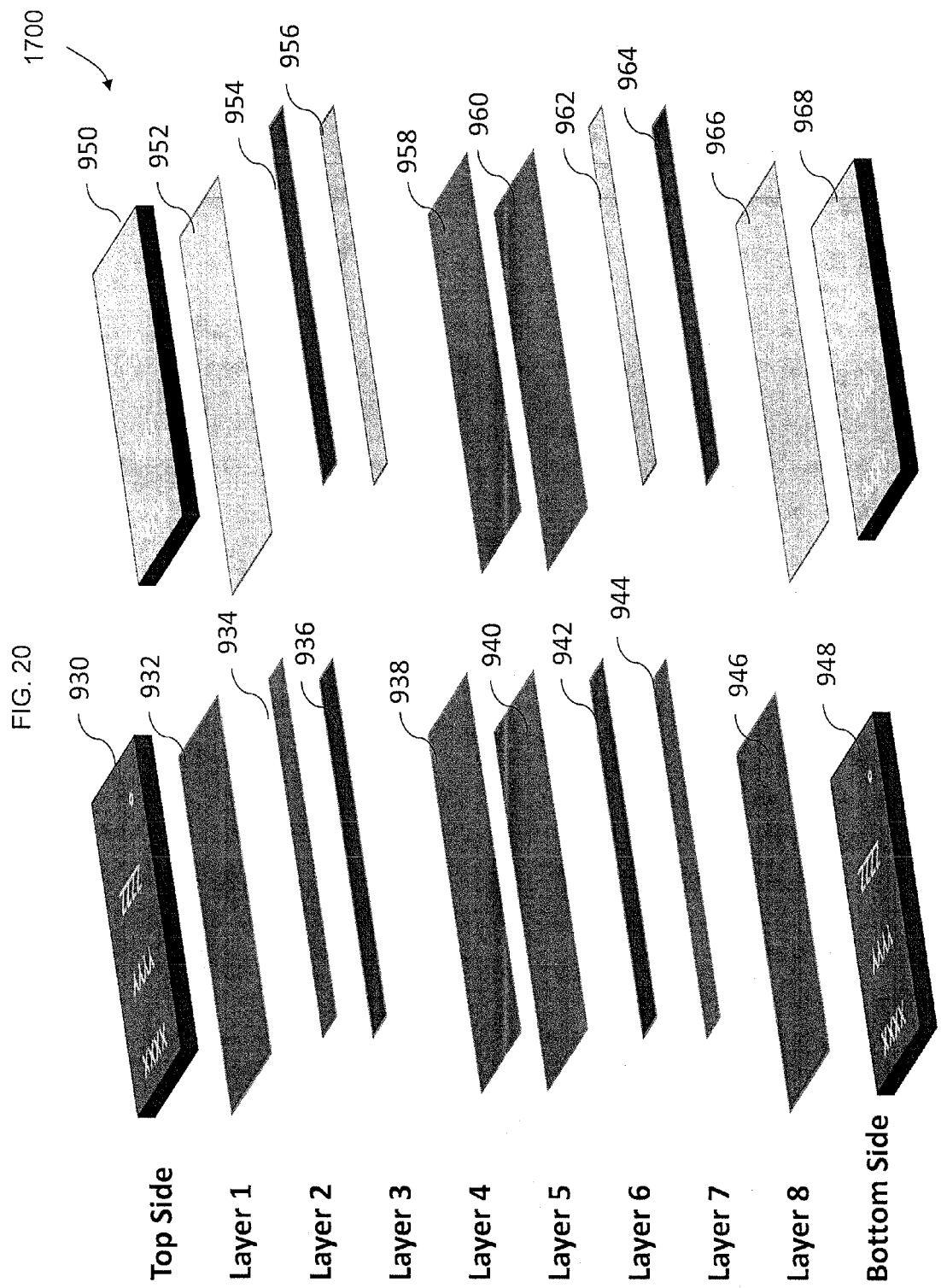

PARALLEL CONNECTION METHODS FOR HIGH PERFORMANCE TRANSISTORS

PRIORITY

This application claims the benefit of U.S. Provisional Patent Application No. 61/528,358, filed Aug. 29, 2011, which is incorporated by reference in its entirety.

FIELD OF TECHNOLOGY

The described embodiments relate to the field of transistor devices, such as gallium nitride transistor devices.

BACKGROUND

Semiconductor devices, such as field effect transistor (FET)-type semiconductor devices (e.g., metal-oxide semiconductor FETs (MOSFETs), junction-gate semiconductor FETs (JFETs), etc.), as well as bipolar junction transistor (BJT) and insulated-gate bipolar transistor (IGBT) devices use the conductive properties of semiconductor materials. Such semiconductor materials may include, for example, silicon (Si) or silicon-containing materials, graphene, germanium (Ge), gallium arsenide (GaAs), or gallium nitride (GaN).

In particular, GaN FET semiconductor devices are increasingly desirable for power semiconductor devices because of their ability to be switched up to ten times faster than commercial MOSFETs, as well as carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET). These types of devices can typically withstand high voltages while operating at high frequencies.

One example of a GaN FET device is a GaN HEMT device, which may include a nitride semiconductor with at least two nitride layers. Different materials formed on the semiconductor or on a buffer layer causes the layers to have different band gaps. The different material in the adjacent nitride layers also causes polarization, which contributes to a conductive two dimensional electron gas (2DEG) region near the junction of the two layers, specifically in the layer with the narrower band gap.

In a GaN semiconductor device, the nitride layers that cause polarization typically include a barrier layer of AlGaN adjacent to a layer of GaN to include the 2DEG, which allows charge to flow through the device. This barrier layer may be doped or undoped. Because of the 2DEG region existing under the gate at zero gate bias, most nitride devices are normally on, or depletion mode devices. If the 2DEG region is depleted, i.e. removed, below the gate at zero applied gate bias, the device can be an enhancement mode device. Enhancement mode devices are normally off and are desirable because of the added safety they provide. An enhancement mode device requires a positive bias applied at the gate in order to conduct current. Examples of GaN semiconductor devices can be found in commonly assigned U.S. Patent Application Publication Nos. 2010/0258912 and 2010/0258843, both of which are incorporated by reference in their entirety.

FIG. 1A illustrates a cross-sectional view of one example of an enhancement mode GaN transistor device 100. Commonly assigned U.S. Patent Application Publication No. 2010/0258843 discloses one example of a process for forming such a device. In FIG. 1, device 100 includes substrate 101, which may be either sapphire, SiC, or silicon, transition layers 102, un-doped GaN material 103, un-doped AlGaN barrier material 104, drain ohmic contact metal 110, source ohmic contact metal 111, a doped p-type AlGaN or p-type GaN layer formed into a doped epitaxial gate 113, and gate metal 112 formed over the doped epitaxial gate 113. A layer of dielectric material 105, such as silicon nitride, covers the barrier material 104, such that a portion 114 of the dielectric material covers gate 113.

FIG. 1B illustrates a top-down view of the transistor device 100, including the location of the gate metal 112. The lettering of transistor device 100 in FIG. 1B is used throughout this description to illustrate the orientation of respective transistor devices. For example, in transistor device 100, source ohmic contact metal 111 may be located on one side (e.g., a right side) of transistor device 100, while drain ohmic contact metal 110 may be located on the other side (e.g., a left side) of transistor device 100.

Transistor devices are often used in devices requiring high current capability and fast switching capability, such as RF amplifiers, switching converters, or other circuits. A well known technique for increasing current-handling capabilities of devices is to use multiple transistors devices connected in parallel. Paralleling of transistor devices increases their current capability, thereby increasing the power throughput of the circuit. Paralleling of transistor devices is also frequently used to distribute heat loss in devices.

Examples of paralleled transistors are described, for example, in U.S. Pat. No. 7,330,046, entitled "Circuits and Methods for Failure Prediction of Parallel MOSFETs," and, for example, in J. Forsythe, International Rectifier, "Paralleling of Power MOSFETs for higher Power Output," which are hereby incorporated by reference in their entirety. Examples of RF applications of paralleled transistors are described, for example, in H. Granberg, Motorola Inc. Engineering Bulletin EB 104, "GET 600 WATTS RF FROM FOUR POWER FETs" (1983), and R. Frey, Microsemi Power Products Group Application Note 1814, "Paralleling MOSFETs in RF Amplifiers" (2010), which are hereby incorporated by reference in their entirety.

One common application for paralleled transistor devices is a switching device including a paralleled group of transistors (e.g., GaN transistors) configured to act as a single transistor. The paralleled transistors may include a single gate driver for the switching device.

FIG. 2 illustrates one example of a conventional design layout for a paralleled switching circuit 120. Circuit 120 includes four pairs of parallel transistor devices $Q_{upper1}$, $Q_{upper2}$, $Q_{upper3}$, $Q_{upper4}$, $Q_{lower1}$, $Q_{lower2}$, $Q_{lower3}$, $Q_{lower4}$, each of which may be, for example, GaN FET transistor devices, MOSFET transistor devices, or other transistor devices known in the art. The parallel transistor devices $Q_{upper1}$, $Q_{upper2}$, $Q_{upper3}$, $Q_{upper4}$, $Q_{lower1}$, $Q_{lower2}$, $Q_{lower3}$, $Q_{lower4}$, are formed on a single side of a printed circuit board (PCB). Upper parallel transistor devices $Q_{upper1}$, $Q_{upper2}$, $Q_{upper3}$, and $Q_{upper4}$ are driven by a common gate transfer control line 212, and lower parallel transistor devices $Q_{lower1}$, $Q_{lower2}$, $Q_{lower3}$, $Q_{lower4}$ are driven by a common gate transfer control line 214. Each set of upper and lower transistors in circuit 120 includes one or more respective decoupling capacitors 202, 204, 206, 208. A switch node current 216 of circuit 120 (i.e., an output current) exits circuit 120 in a lengthwise direction.

In the design of a paralleled switching circuit, or any other circuit including paralleled transistor devices, however, numerous factors must be accounted for to realize an efficient and reliable circuit. In particular, different types of transistor devices have different requirements and design considerations for implementation in parallel circuits. For example, when paralleling GaN FETs, the characteristics of the GaN transistors to be used must be considered. Most notably, the selection of devices, such as whether to use more small devices or fewer large devices to achieve the desired circuit parameters, whether the selected devices have positive or negative temperatures coefficients for certain key characteristics, such as threshold voltage $V_{th}$ and drain-source resistance $R_{DSon}$, and whether part-to-part and/or lot-to-lot variations may affect the overall design.

Another consideration for designing transistor devices, and in particular GaN FET semiconductor devices, is the layout of the circuit. Layout designs should take into account various factors including printed circuit board (PCB) restrictions (including board populating) and placement and routing design. In addition, GaN semiconductor devices require additional considerations due to their small size, compact connection structure, and high demand on specifications such as current and voltage.

Another area that must be considered is the parameters of the circuits themselves. Circuits employing FET devices typically require certain circuit changes to ensure maximum performance from each of the devices, and to ensure that the paralleled switch can function at near theoretical maximum performance.

For example, one parameter that must be controlled is the Miller capacitances in the circuit. The Miller capacitance represents the increased equivalent input capacitance in an amplifier due to amplification of capacitance between the input and output terminals of the amplifier. In a transistor, Miller capacitance is driven by the rate of change over time of the voltage (dv/dt) of the transistor. Miller capacitance can induce a current into the gate path during switching events.

As another example, because GaN transistor devices are designed to have increased switching frequency and improved packaging, they are particularly sensitive to common source inductance (CSI). CSI is a parasitic inductance at a common source node, which can generate a voltage that is shared by the drain-to-source current path and the gate driver loop of a transistor device. In a transistor, CSI is dependent upon the rate of change over time of the current (di/dt) flowing through the transistor. CSI can induce unwanted gate voltages into a transistor device. Common source inductance between paralleled transistors is described, for example, in A. Elbanhawy, Fairchild Semiconductor Application Note AN-7019, "Limiting Cross-Conduction Current in Synchronous Buck Converter Designs" (Rev. A. 2005), which is hereby incorporated by reference in its entirety.

FIG. 3 illustrates the effect of CSI in a circuit 150 including a pair of parallel transistor devices $Q_1$, $Q_2$, which may be, for example, GaN FET transistor devices, connected in parallel. A first transistor device $Q_1$ includes parasitic capacitances including drain-to-source capacitance $C_{ds1}$, gate-to-drain capacitance $C_{gd1}$, and gate-to-source capacitance $C_{gs1}$. A second transistor device $Q_2$ includes parasitic capacitances including drain-to-source capacitance $C_{ds2}$, gate-to-drain capacitance $C_{gd2}$, and gate-to-source capacitance $C_{gs2}$. The gates of first and second transistor devices $Q_1$, $Q_2$ are electrically connected to a common voltage driver $V_{GateDrive}$ via respective gate transfer control lines 222, 224. Each gate transfer control line 222, 224 includes a respective gate transfer control line inductance $L_{G1}$, $L_{G2}$. First and second transistor devices $Q_1$, $Q_2$ may be, for example, low-side transistors in a switching device, with their drains connected to one or more upper-side transistors $Q_{UpperSW}$.

First and second transistor devices $Q_1$, $Q_2$ share a common source node 216 that experiences parasitic common source inductances $L_{CSP1}$ and $L_{CSP2}$ connected in series with $L_{CSG1}$ and $L_{CSG2}$, respectively. FIG. 3 shows one example of a gate driver loop current $I_{dv/dt}$ that may be formed as a result of the Miller capacitances of transistor device $Q_1$, and a gate voltage $V_{di/dt}$ that may be generated as a result of common source inductance $L_{CSP1}$ of transistor device $Q_1$. As shown in circuit 150, the source current $I_{L\_CS}$ of first transistor device $Q_1$ flows through the common source inductance $L_{CSP1}$, creating a voltage $V_{di/dt}$ at the gate of transistor device $Q_1$ when source current $I_{L\_CS}$ is transient. Because voltage $V_{di/dt}$ affects the voltage on the gate driver loop of transistor devices $Q_1$, $Q_2$, a change of source current $I_{L\_CS}$ (e.g., during transient events) may undesirably affect operation of one or both of transistor devices $Q_1$, $Q_2$. For example, in some cases, voltage $V_{di/dt}$ could turn transistor device $Q_1$ and/or transistor device $Q_2$ on and/or off unexpectedly. In other cases, voltage $V_{di/dt}$ could potentially overload the voltage at the respective gates when transistor devices $Q_1$, $Q_2$ are turned on. Particularly for GaN devices and other semiconductor devices with high switching frequency capability and/or frequent current transients, it is desirable to maintain a low common source inductance. It is further beneficial to prevent unexpected gate turn on for Q1 during a high dv/dt event that can inject current into the gate driver loop via Miller capacitances. Keeping the common source inductance low also keeps the gate loop impedance low, thereby raising the threshold magnitude of the Miller-induced current that will corrupt the gate of the transistor.

Accordingly, there is a need and desire for a semiconductor device, circuit, layouts for such devices, and methods of forming such devices and circuits, that experience reduced negative effects from common source inductance, inter device inductance and other detrimental effects.

BRIEF DESCRIPTION OF THE DRAWINGS

FIG. 1B shows a top-down view physical drawing of a conventional gallium nitride (GaN) semiconductor device.

FIG. 8A shows a layout view of a semiconductor switching circuit, in accordance with embodiments described herein.

FIG. 16 shows a layout of a semiconductor switching circuit, in accordance with embodiments described herein.

FIGS. 18A and 18B illustrate gate connections between paralleled transistors, in accordance with embodiments described herein.

FIG. 19 shows a cross-sectional view of a portion of a printed circuit board including parallel transistors, in accordance with embodiments described herein.

FIG. 20 shows a cross-sectional view of a portion of a printed circuit board including parallel transistors, in accordance with embodiments described herein.

DETAILED DESCRIPTION

In the following detailed description, reference is made to certain embodiments. These embodiments are described with sufficient detail to enable those skilled in the art to practice them. It is to be understood that other embodiments may be employed and that various structural, logical, and electrical changes may be made.

Embodiments described herein provide circuitry and methods of operation for parallel transistor devices. Techniques and geometries for reducing the undesirable effects of common source inductance (CSI) in parallel devices, such as GaN transistor devices, are described herein. Described embodiments include transistor circuits with layouts that provide spatial separation of the gate and drain current loops. The layout designs ensure that the currents between these loops remain perpendicular to each other, and thus remain decoupled. Other described embodiments include electrical connections, printed circuit board (PCB) layouts, and other features that can further reduce the impact of common source inductance experienced by transistor devices within the circuit.

While embodiments described herein may be described in connection with certain types of transistor devices, such as GaN transistor devices, it should be understood that the invention is not so limited. For example, the described embodiments may be applicable to transistor devices and other types of semiconductor devices that use different conductive materials, such as, for example, silicon (Si) or silicon-containing materials, graphene, germanium (Ge), gallium arsenide (GaAs). Described embodiments are also applicable to other types of semiconductor devices, such as other field effect transistor (FET)-type semiconductor devices (e.g., metal-oxide semiconductor FETs (MOSFETs), junction-gate semiconductor FETs (JFETs), etc.), bipolar junction transistor (BJT) devices, and insulated-gate bipolar transistor (IGBT) devices. The described concepts are also equally applicable to silicon-on-oxide (SOI) transistor devices. In addition, the described concepts are equally applicable to both enhancement mode and depletion mode transistor devices. In addition, while specific embodiments are described in connection with paralleled switching devices, it should be understood that features described herein are generally applicable to other types of circuits, such as RF amplifiers, switching converters, devices of different yet similar physical structure, and other circuits.

Figure 3:
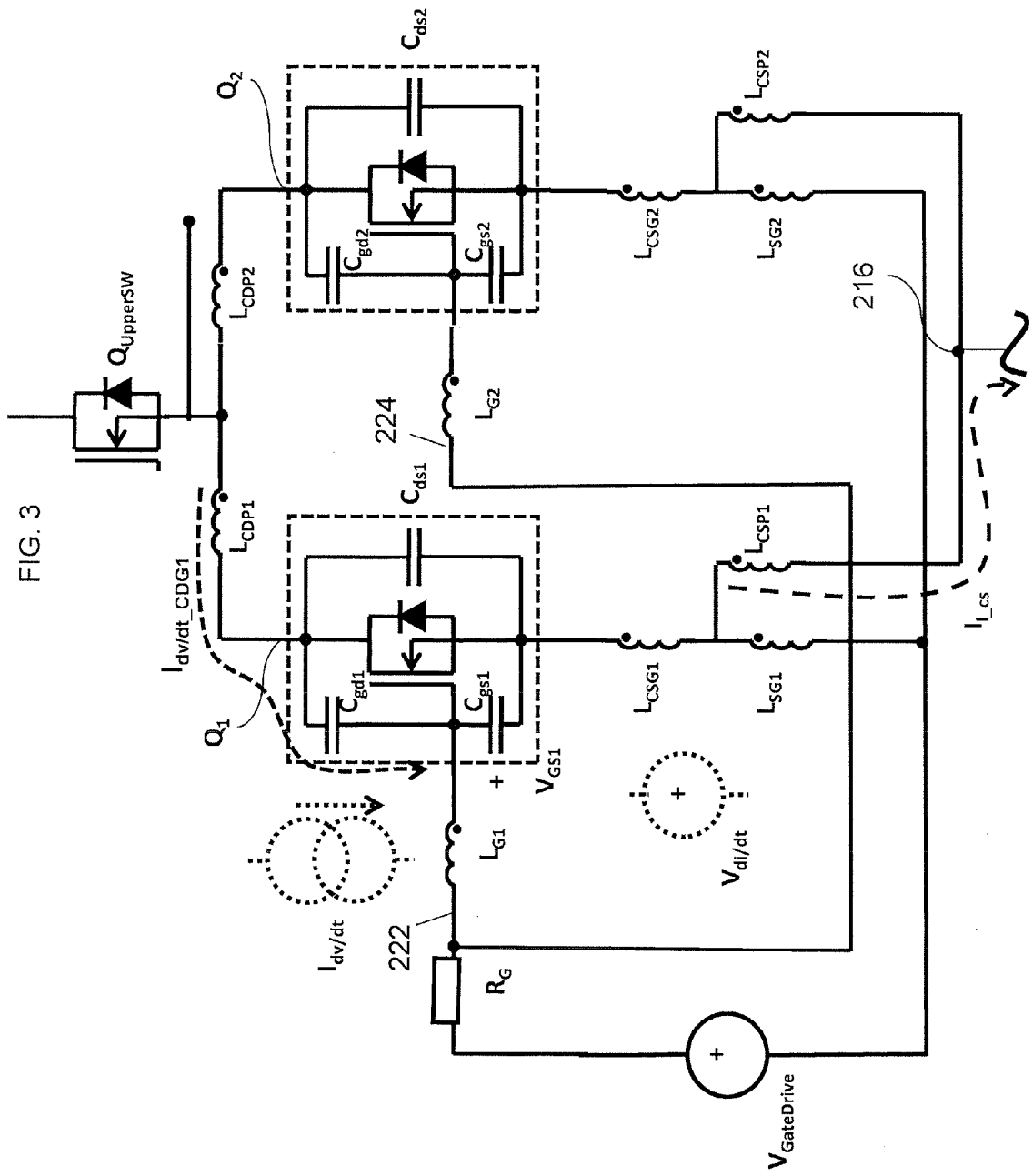
FIG. 3 shows a schematic view of a switching circuit including paralleled transistor devices.
Figure 4B:
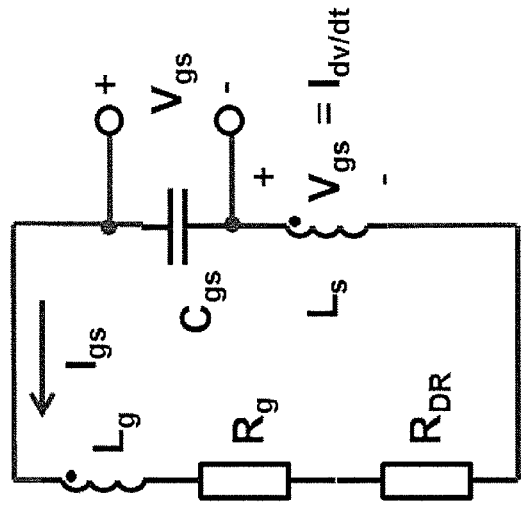
FIGS. 4A and 4B show schematic views of the simplified gate loops including parasitic elements determining the immunity to change in voltage over time and change in current over time, respectively.
Figure 4A:
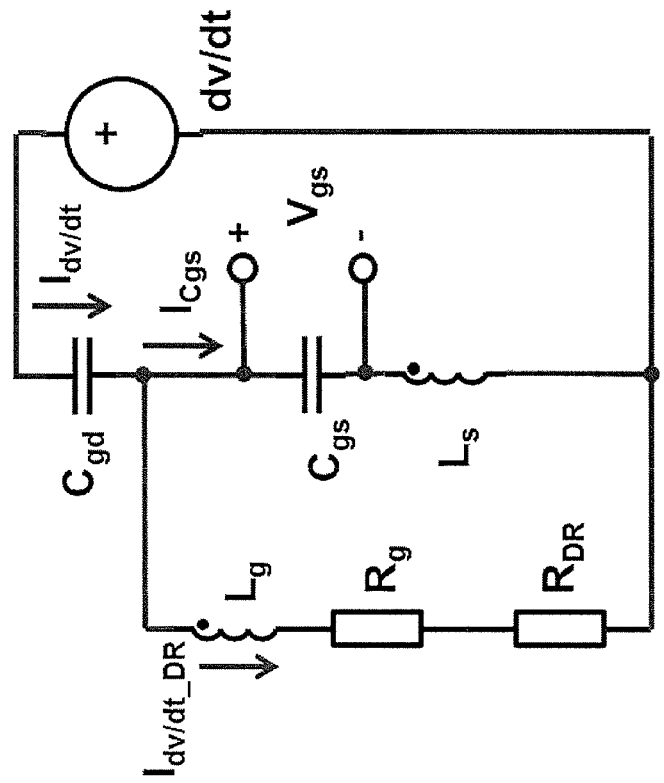

FIGS. 4A and 4B show simplified schematics representing gate loops for a transistor device (e.g., device $Q_1$ of FIG. 3). FIG. 4A has been simplified to show the parasitic elements that can affect the transistors device's immunity to a change in voltage dv/dt, and simplifies to a current divider. FIG. 4B has been simplified to show the parasitic elements that can affect the transistor device's immunity to a change in current di/dt, and simplifies to a voltage divider.

Applicants have derived an empirical formula—Equation 1, representing the simplified form for di/dt immunity for switching devices:

$$\frac{di}{dt} = \frac{V_{th} \cdot \left[1 + R_g + R_{DR} + \left[\frac{\sqrt{L_g \cdot C_{gs}}}{L_g + C_{gs}}\right]\right]}{L_s} \qquad \text{Equation 1}$$

In Equation 1, di/dt is the rate of change in current through source inductor [measured in Amperes per second], $V_{th}$ is the threshold voltage of the switch [measured in Volts], $R_g$ is the gate resistance [measured in ohms], $R_{DR}$ is the gate driver output resistance [measured in ohms], $L_g$ is the gate inductance [measured in henries], $C_{gs}$ is the gate-to-source capacitance [measured in Farads], and $L_s$ is the source inductance [measured in henries]. Equation 1 applies to both single transistor devices and to multiple paralleled transistors.

Applicants have derived an empirical formula—Equation 2, representing the simplified form for dv/dt immunity for switching devices:

$$\frac{dv}{dt} = \frac{V_{th}}{C_{gd} \cdot \left[R_g + R_{DR} + \sqrt{\frac{(L_g + L_s)}{C_{gs}}}\right]} \qquad \text{Equation 2}$$

In Equation 2, dv/dt is the rate of change in voltage across drain-source [measured in Volts per second], $V_{th}$ is the threshold voltage of the switch [measured in Volts], $C_{gd}$ is the gate-to-drain capacitance [measured in Farads], $R_g$ is the gate resistance [measured in ohms], $R_{DR}$ is the gate driver output resistance [measured in ohms], $L_g$ is the gate inductance [measured in henries], $C_{gs}$ is the gate-to-source capacitance [measured in Farads], and $L_s$ is the source inductance [measured in henries].

Through a detailed analyses and simulations of these and other circuits, Applicants have determined several considerations for the paralleling of transistor devices, and in particular, paralleling GaN transistor devices. One consideration is that the source inductance must be maintained as low as possible, including by increasing drain inductance if necessary. Another consideration is that the gate inductance will usually always be higher than the source inductance (often with ratios at or exceeding 10:1), due to the narrow width and length of the gate driver transmission line from the gate driver to the gate of the transistor device. Another consideration is that the gate driver source and sink impedance can be configured to further improve switching performance using dv/dt reduction, but this may be detrimental to the efficiency of the switching circuit. Another consideration is that a complete solution, including gate inductance, results in a third order differential system (i.e., $d^3/dt^3$) with both sinusoidal and exponential terms that require a numerical analysis for a solution.

The conflicting requirements for controlling the change in voltage across a switching device (dv/dt) and change in current through the switching device (di/dt) can be addressed by designs that yield a lowest possible CSI, thereby reducing its effect on the gates of the circuits. In particular, because GaN transistors typically have lower drive voltage capability, lower gate resistance, and lower capacitances than corresponding MOSFET devices, the effect of the common source inductance and dv/dt induced current on the gate circuit on transistors using GaN transistors are much more pronounced than in devices utilizing MOSFETs. The physical layouts of the gates of the transistors can be arranged to be electrically close to yield the lowest possible inductance.

Figure 1A:
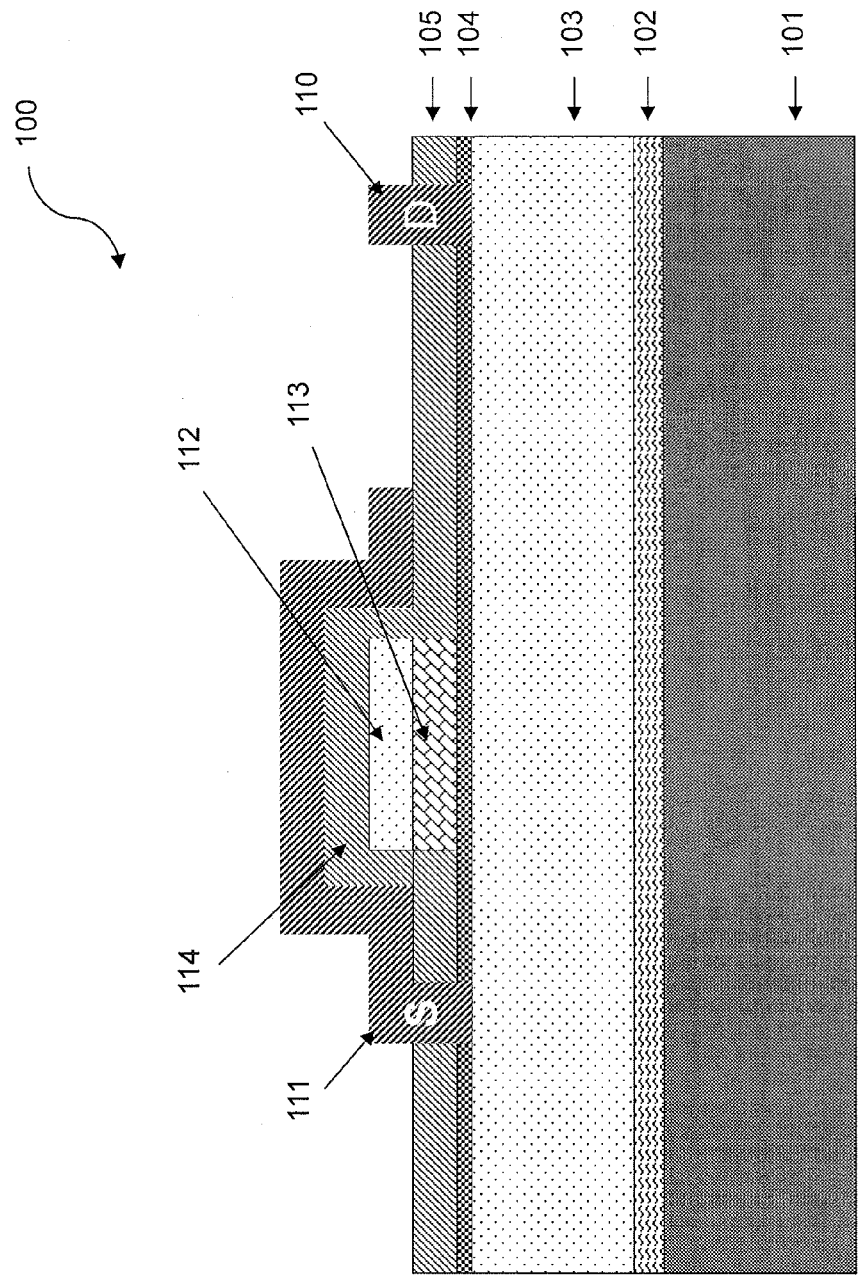
FIG. 1A shows a cross sectional view of a conventional gallium nitride (GaN) semiconductor device.
Figure 2:
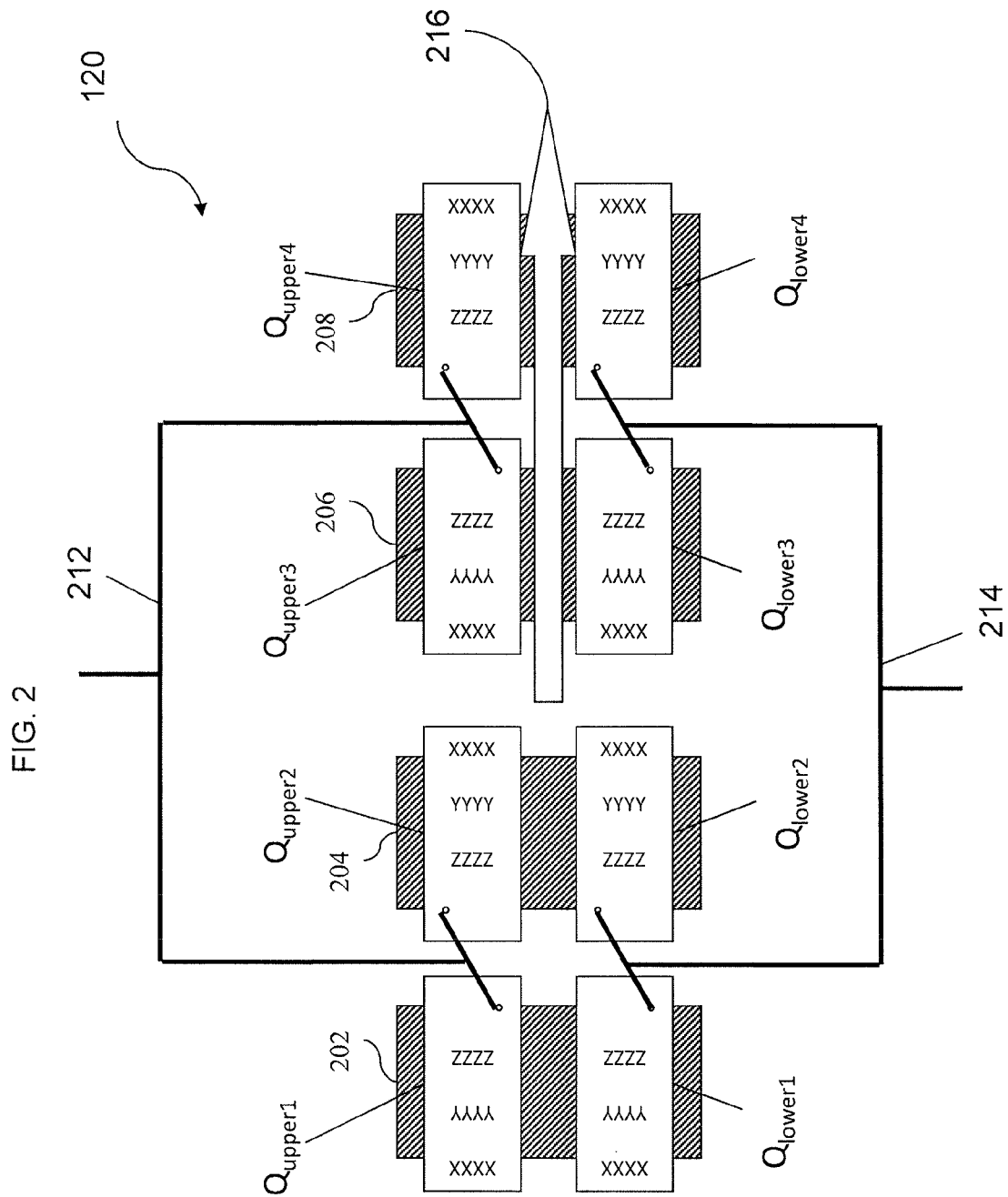
FIG. 2 shows a top-down view of a design layout using GaN semiconductor devices that would be typical for most designers to parallel devices.
Figure 5A:
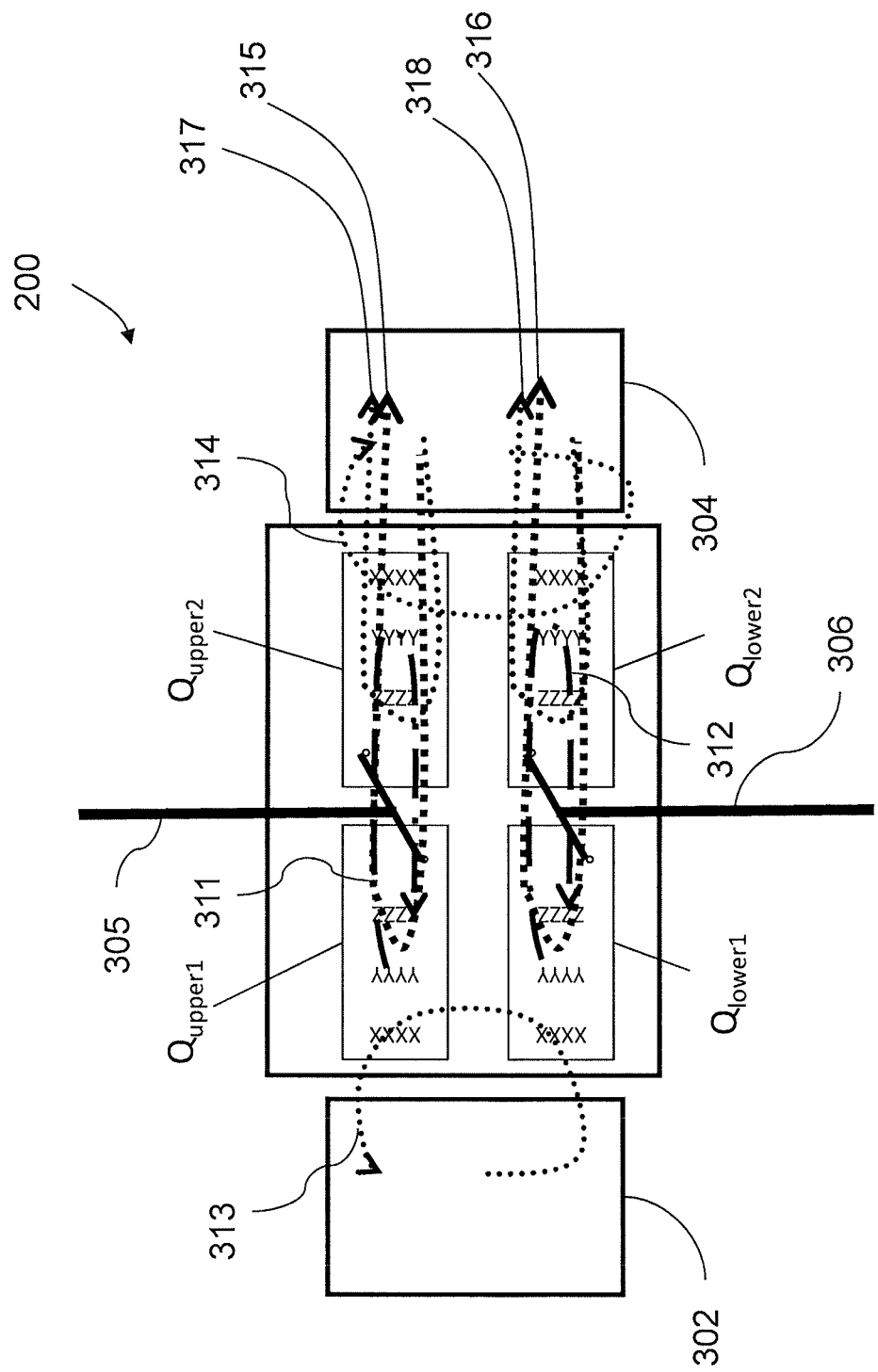
FIG. 5A shows a top view of a semiconductor switching circuit without spatial separation of drain and gate current loops.

Prior to describing embodiments of the present invention, a description will be given of the operation of common source inductance on a circuit including parallel transistor devices. FIG. 5A is a top-down view of a circuit 200 including two sets of paralleled semiconductor devices, $Q_{upper1}$ and $Q_{upper2}$, and $Q_{lower1}$ and $Q_{lower2}$, arranged in a half-bridge configuration. Circuit 200 may be used, for example, in a switching converter, or other types of circuits, particularly those in which high current capability and/or heat dissipation spreading is desirable, such as part of circuit 120 in FIG. 2. Circuit 200 includes four transistor devices, such as GaN FETs, including first and second upper transistor devices $Q_{upper1}$ and $Q_{upper2}$ arranged in parallel, and first and second lower transistor devices $Q_{lower1}$ and $Q_{lower2}$ arranged in parallel. First and second upper transistor devices $Q_{upper1}$ and $Q_{upper2}$ and first and second lower transistor devices $Q_{lower1}$ and $Q_{lower2}$ may be, for example, enhancement or depletion mode semiconductor devices, such as GaN HEMT semiconductor devices, or any other suitable type of transistor device.

Circuit 200 also includes a supply decoupling elements 302 and 304, for decoupling circuit 200 from electrical interference of a power supply, adjacent circuitry and/or other elements and to buffer high currents of short duration from the main supply to provide a stable high frequency-capable DC supply to the transistor devices. Supply decoupling elements 302, 304 may be, for example, physical capacitors, such as multilayer type ceramic capacitors (MLCC). Gate driver transfer lines 305, 306 run perpendicular to the lengthwise direction of the respective upper set of transistors $Q_{upper1}$, $Q_{upper2}$ and lower set of transistors $Q_{lower1}$, and $Q_{lower2}$. FIG. 5A also includes a plurality of current loops 311-318 that are present during operation of circuit 200, which are described in further detail in connection with FIGS. 6A-6D below.

Figure 5B:
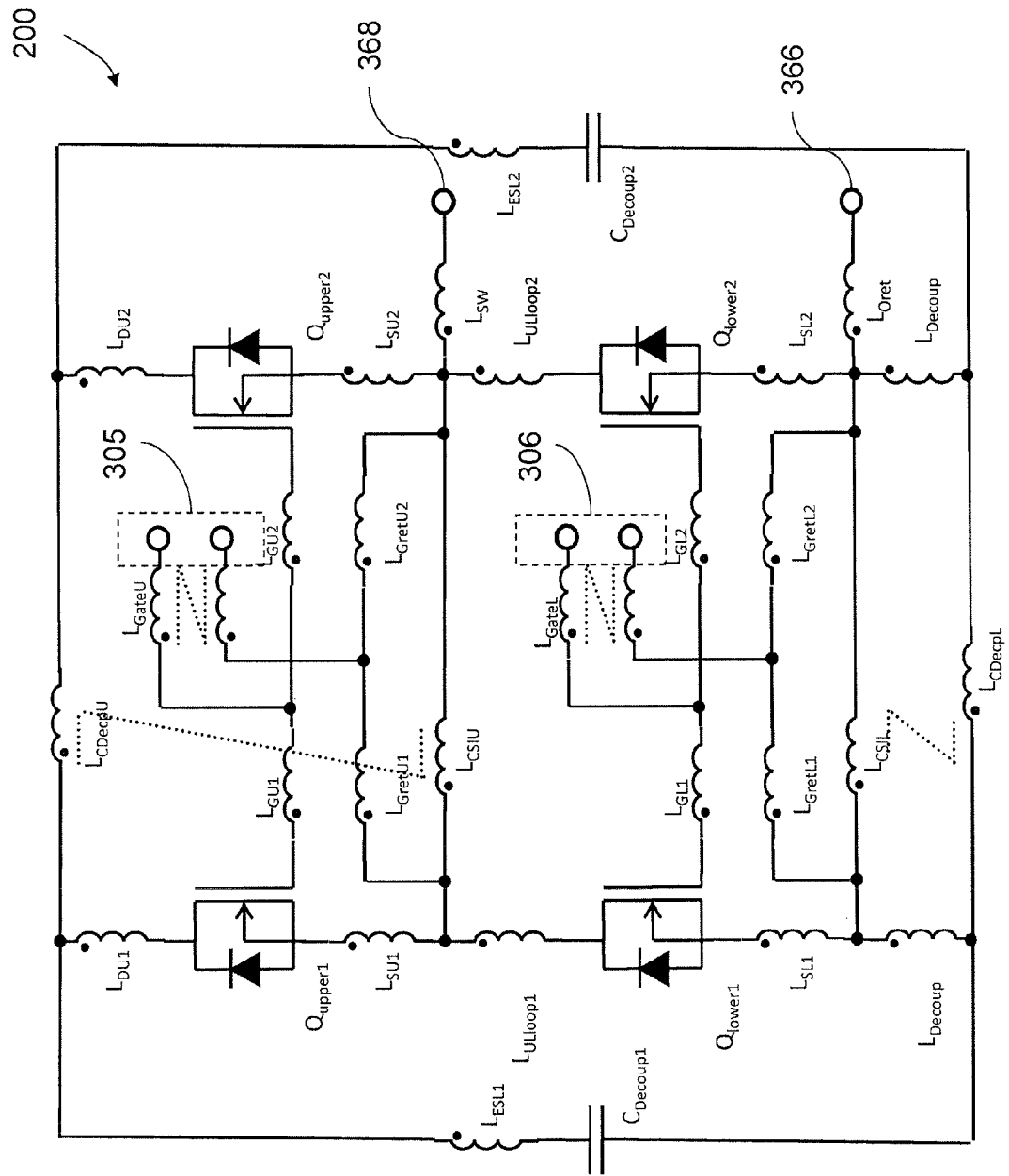
FIG. 5B shows a schematic view of the semiconductor switching circuit of FIG. 5A.

FIG. 5B is a schematic diagram illustrating physical and parasitic circuit elements in circuit 200. Circuit 200 includes a switch output connection 368 through which a drain-source current is output from circuit 200, and a gate return connection 366. Circuit 200 also includes connections to gate transfer control lines 305, 306.

Upper transistor devices $Q_{upper1}$ and $Q_{upper2}$ include respective parasitic drain inductances $L_{DU1}$ and $L_{DU2}$, respective parasitic gate inductances $L_{GU1}$ and $L_{GU2}$, and respective parasitic source inductances $L_{SU1}$ and $L_{SU2}$. Upper transistor devices $Q_{upper1}$ and $Q_{upper2}$ also include respective gate return inductances $L_{GretU1}$ and $L_{GretU2}$ between their respective sources and drains. Upper transistor devices $Q_{upper1}$ and $Q_{upper2}$ share a common source inductance $L_{CSIU}$. In addition, upper transistor devices $Q_{upper1}$ and $Q_{upper2}$ share a common gate inductance $L_{GateU}$. A parasitic inter-connection inductance $L_{CDecpU}$ is included between the respective drains of $Q_{upper1}$ and $Q_{upper2}$.

Lower transistor devices $Q_{lower1}$ and $Q_{lower2}$ include respective parasitic source inductances $L_{SL1}$ and $L_{SL2}$, and respective parasitic gate inductances $L_{GL1}$ and $L_{GL2}$. Lower transistor devices $Q_{lower1}$ and $Q_{lower2}$ also include respective gate return inductances $L_{GretL1}$ and $L_{GretL2}$ between their respective sources and drains. Lower transistor devices $Q_{lower1}$ and $Q_{lower2}$ share a common source inductance $L_{CSIL}$. In addition, lower transistor devices $Q_{lower1}$ and $Q_{lower2}$ share a common gate inductance $L_{GateL}$. A parasitic inter-connection inductance $L_{CDecpL}$ is included between the respective sources of $Q_{upper1}$ and $Q_{upper2}$.

Other elements shown in FIG. 5B include the respective capacitances $C_{Decoup1}$, $C_{Decoup2}$ of supply decoupling elements 302, 304 (FIG. 5A). Circuit 200 also includes respective parasitic equivalent series inductances $L_{ESL1}$, $L_{ESL2}$ for supply decoupling elements 302, 304. Other parasitic elements include the inductance of the switch node connection $L_{SW}$, the inductance of the output return $L_{Oret}$, the inductance between the respective first and second upper and lower loops $L_{ULloop1}$, $L_{ULloop2}$, and the ground decoupling connection inductance of lower transistors $L_{Decoup}$. Although not shown in FIG. 5B, each transistor device $Q_{upper1}$, $Q_{upper2}$, $Q_{lower1}$, and $Q_{lower2}$ would typically also include parasitic source-drain, gate-source, and gate-drain capacitances, as shown in FIG. 3.

As discussed above in connection with FIG. 5A, circuit 200 also includes a plurality of current loops 311-318 that are present during operation of circuit 200. FIGS. 6A-6D illustrate these current loops on the schematic representation of circuit 200 shown in FIG. 5B.

Figure 6A:
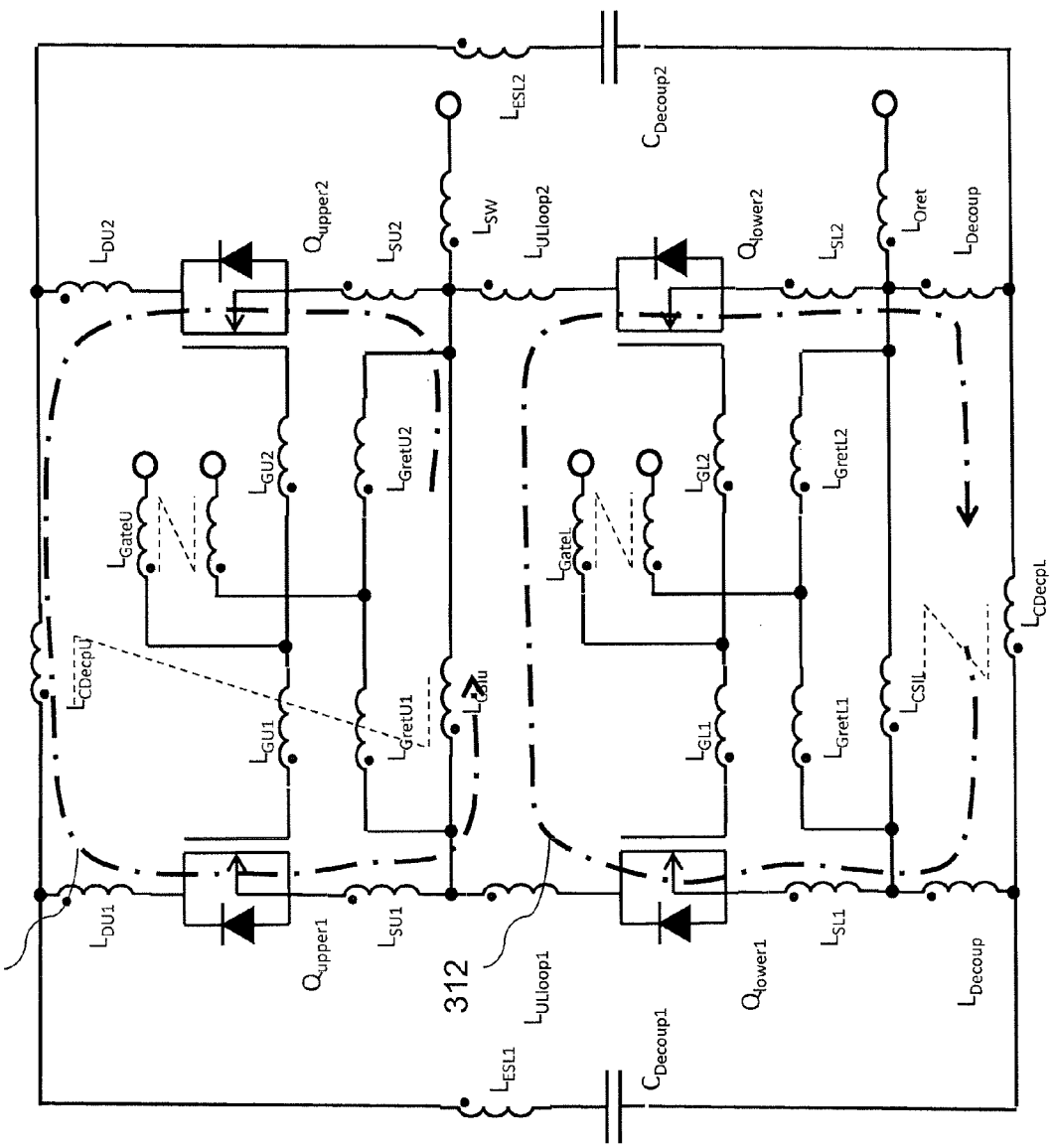
FIGS. 6A-6D show a schematic view of current loops within the semiconductor switching circuit of FIG. 5B.
Figure 6B:
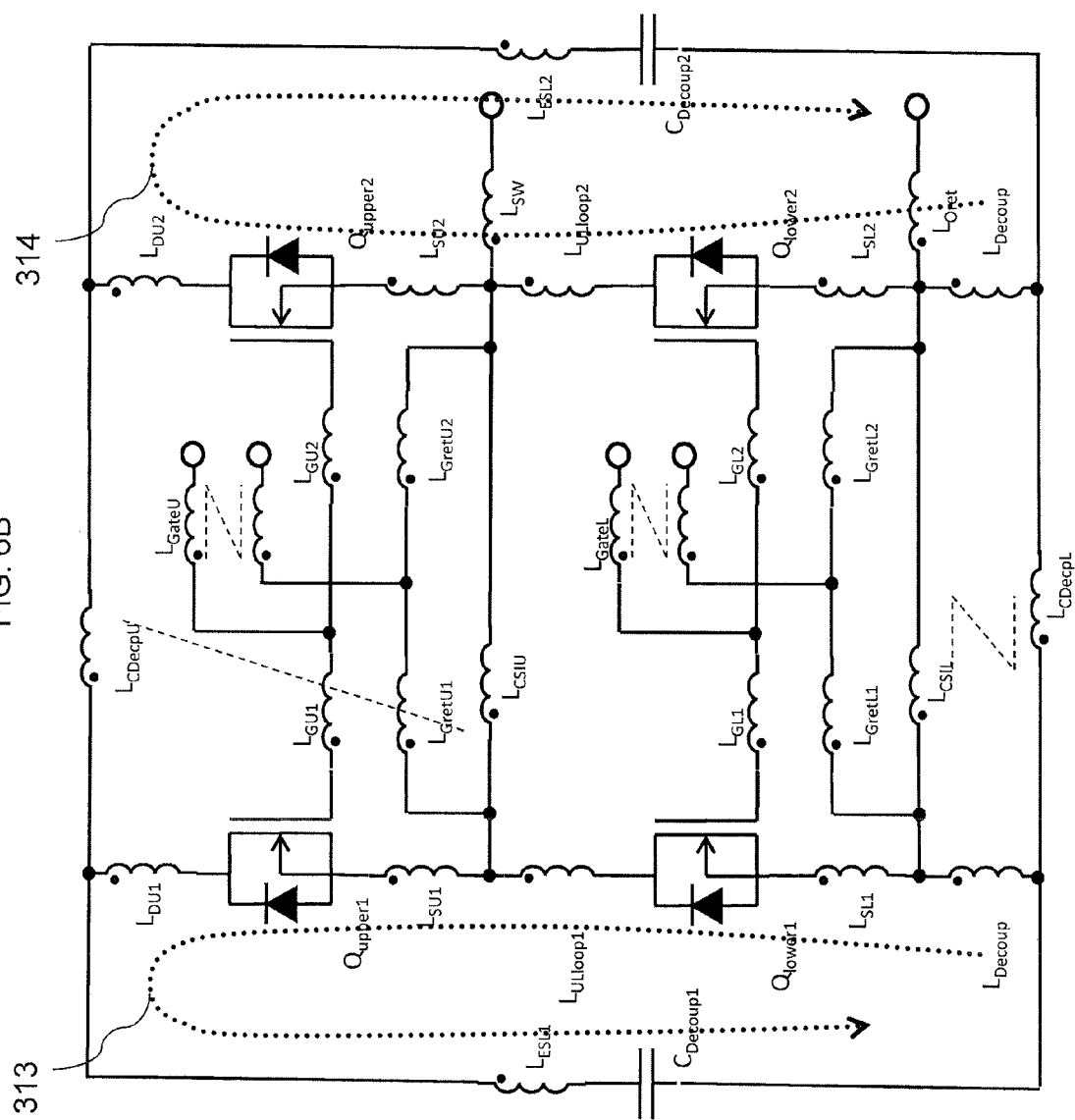

For example, FIG. 6A shows respective upper switch inter-device current loop 311 within the upper set of parallel of transistors $Q_{upper1}$ and $Q_{upper2}$, and lower switch inter-device current loop 312 within the lower parallel sets of transistors $Q_{lower1}$ and $Q_{lower2}$. Upper and/or lower switch inter-device current loops 311, 312 may manifest when an imbalance occurs between the paralleled transistor devices, for example due to small differences in device parameters (e.g., respective threshold voltages Vth). FIG. 6B shows respective first and second side supply decoupling current loops 313, 314, representing the path that a supply current travels between supply decoupling element 302 (FIG. 5A) and the set of first side transistor devices $Q_{upper1}$, $Q_{lower1}$, and supply decoupling element 304 (FIG. 5A) and the set of second side transistor devices $Q_{upper2}$, $Q_{lower2}$, respectively.

Figure 6C:
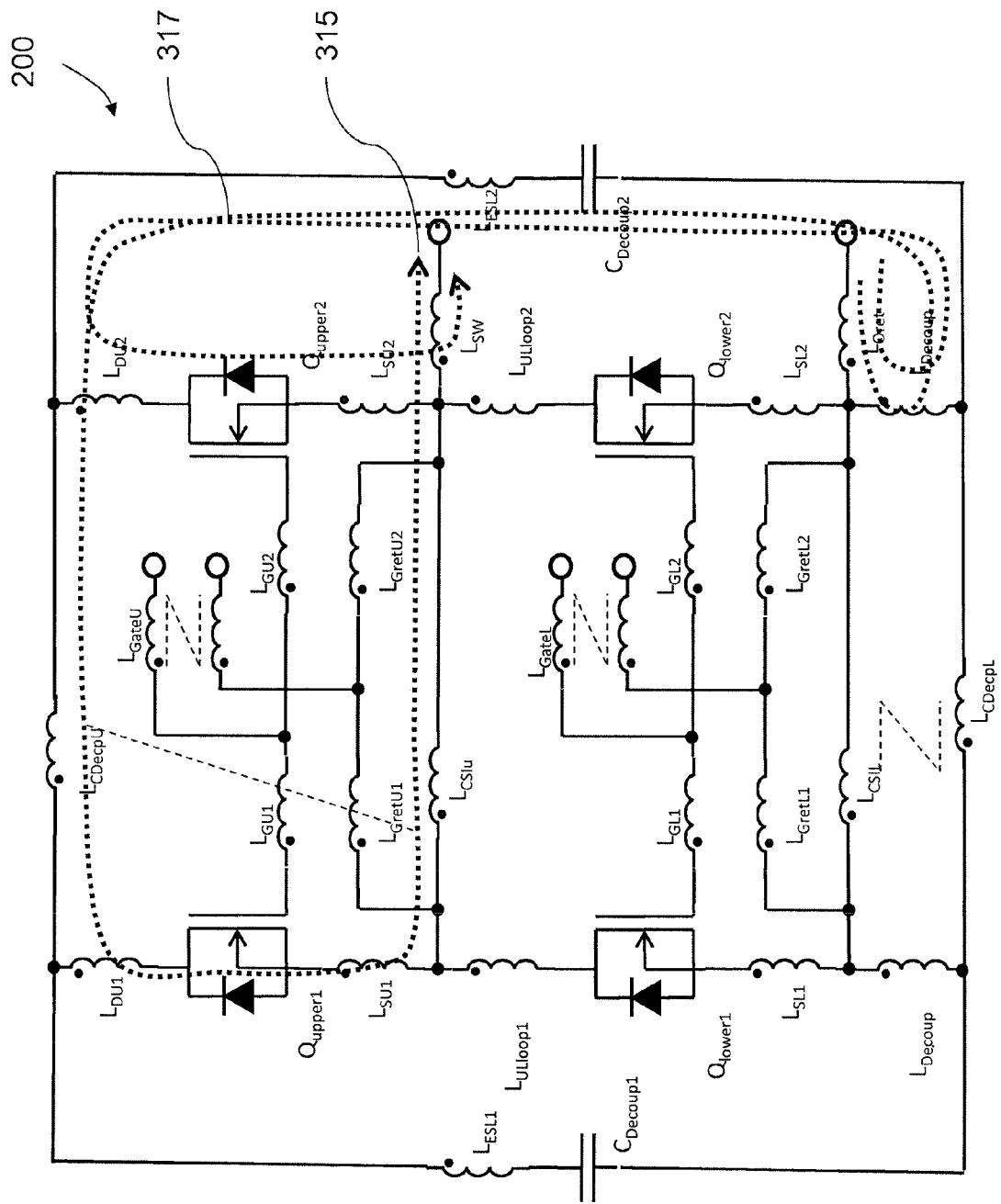
Figure 6D:
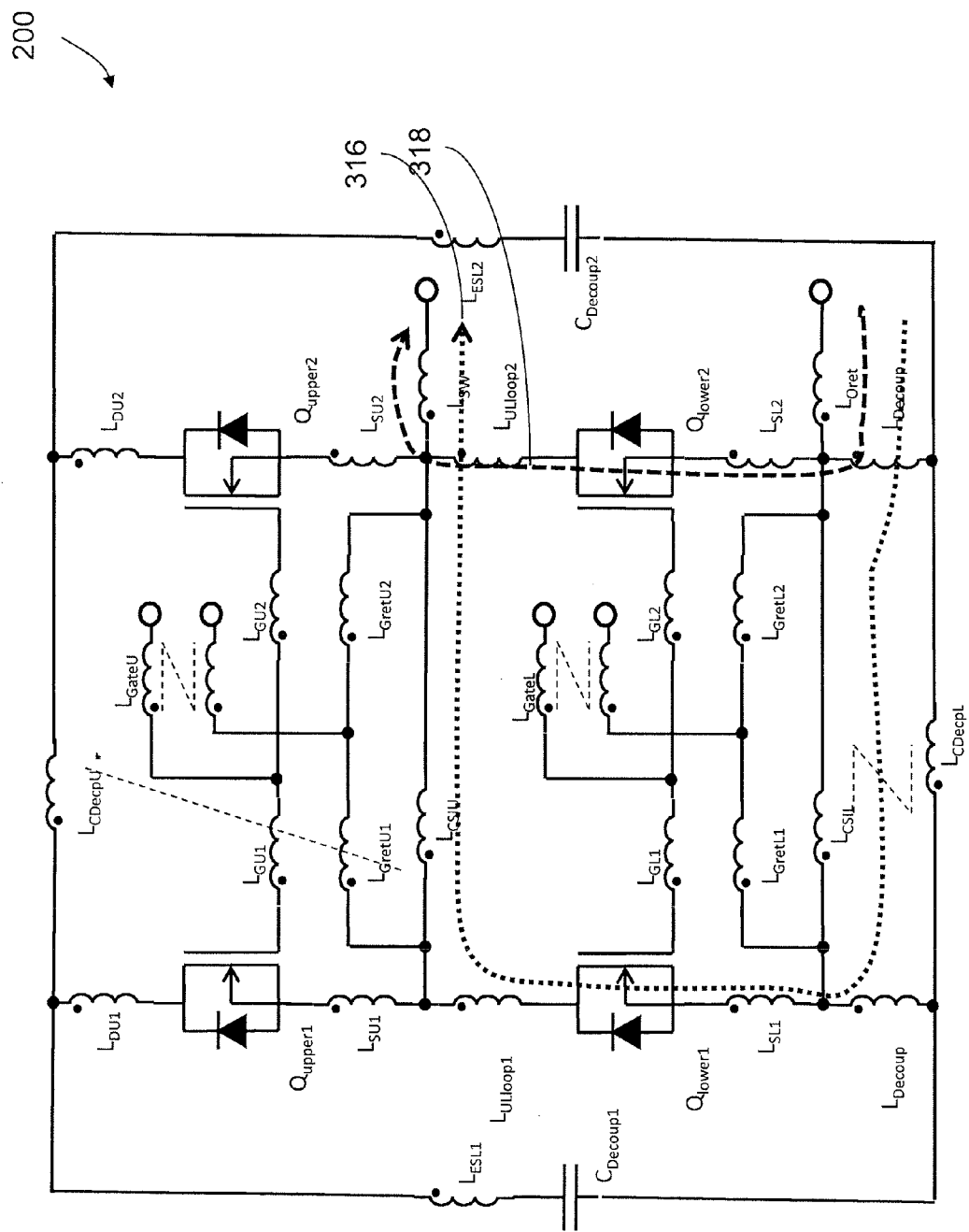

FIG. 6C shows an upper first side supply-to-load current loop 315 representing the path that current takes from first side upper transistor device $Q_{upper1}$ to the switch output node 368, and an upper second side supply-to-load current loop 317 presenting the path that current takes from second side upper transistor device $Q_{upper2}$ to switch output node 368. FIG. 6D shows a lower first side return-to-load current loop 316 representing the path that current takes from first side lower transistor device $Q_{lower1}$ to the switch output node 368, and a lower second side return-to-load current loop 318 representing the path that current takes from second side lower transistor device $Q_{lower1}$ to switch output node 368. As shown in FIGS. 6C and 6D, there is a net current (i.e., from upper first side supply-to-load current loop 315 and lower first side return-to-load current loop 316) flowing in upper common source inductance $L_{CSIU}$.

As shown in FIG. 5A, first and second upper transistor devices $Q_{upper1}$ and $Q_{upper2}$ and first and second lower transistor devices $Q_{lower1}$ and $Q_{lower2}$ are arranged lengthwise to one another, respectively, with upper first side supply-to-load current loop 315, lower first side return-to-load current loop 316, upper second side supply-to-load current loop 317, and lower second side return-to-load current loop 318 flowing parallel to the upper switch inter-device current loop 311, the lower switch inter-device current loop 312, and the first and second side supply decoupling current loops 313, 314. Upper first side supply-to-load current loop 315 and upper second side supply-to-load current loop 317 form a drain current for the upper set of first and second upper transistor devices $Q_{upper1}$ and $Q_{upper2}$, and lower first side return-to-load current loop 316 and lower second side return-to-load current loop 318 form a drain current for the lower set of first and second lower transistor devices $Q_{lower1}$ and $Q_{lower2}$.

While the circuit 200 shown in FIG. 5A includes a low supply inductance relative to design layouts described below due to its long narrow layout, circuit 200 exhibits an inferior immunity to transient currents di/dt due to CSI. Returning to FIGS. 6A-6D, upper transistor devices $Q_{upper1}$ and $Q_{upper2}$ share a common source inductance $L_{CSIU}$, and lower transistor devices $Q_{lower1}$ and $Q_{lower2}$ share a common source inductance $L_{CSIL}$. As shown in FIG. 6C, with the drain currents of circuit 200 flowing in parallel with the gate source path, upper first side supply-to-load current loop 315 flows through the upper common source inductance $L_{CSIU}$ to switch node 368, while upper second side supply-to-load current loop 317 flows from a source of $Q_{upper2}$ to switch node 368. As shown in FIG. 6D, lower first side return-to-load current loop 316 flows through the lower common source inductance $L_{CSIL}$ and upper common source inductance $L_{CSIU}$ to switch node 368, while lower second side return-to-load current loop 318 flows from a drain of $Q_{lower2}$ to switch node 368.

Varying current levels flowing through upper and lower common source inductances $L_{CSIU}$, $L_{CSIL}$, such as from transient currents di/dt flowing through devices $Q_{upper1}$, $Q_{upper1}$, $Q_{lower1}$, and $Q_{lower2}$, can induce a voltage ($V_{di/dt}$) across the respective source inductances $L_{CSIU}$ and $L_{CSIL}$. Because a voltage generated at the common source inductance also affects the common gate voltage of transistors $Q_{upper1}$ and $Q_{upper2}$, and the common gate voltage of transistors $Q_{lower1}$ and $Q_{lower2}$, a change of drain current $I_{L\_CSI}$ (e.g., during transient events) induces a voltage on the respective gate-source circuits of transistors $Q_{upper1}$, $Q_{upper1}$, $Q_{lower1}$, and $Q_{lower2}$. Accordingly, the design shown in FIG. 5A exhibits a relatively low immunity to transient currents, compared to embodiments described below.

Figure 7:
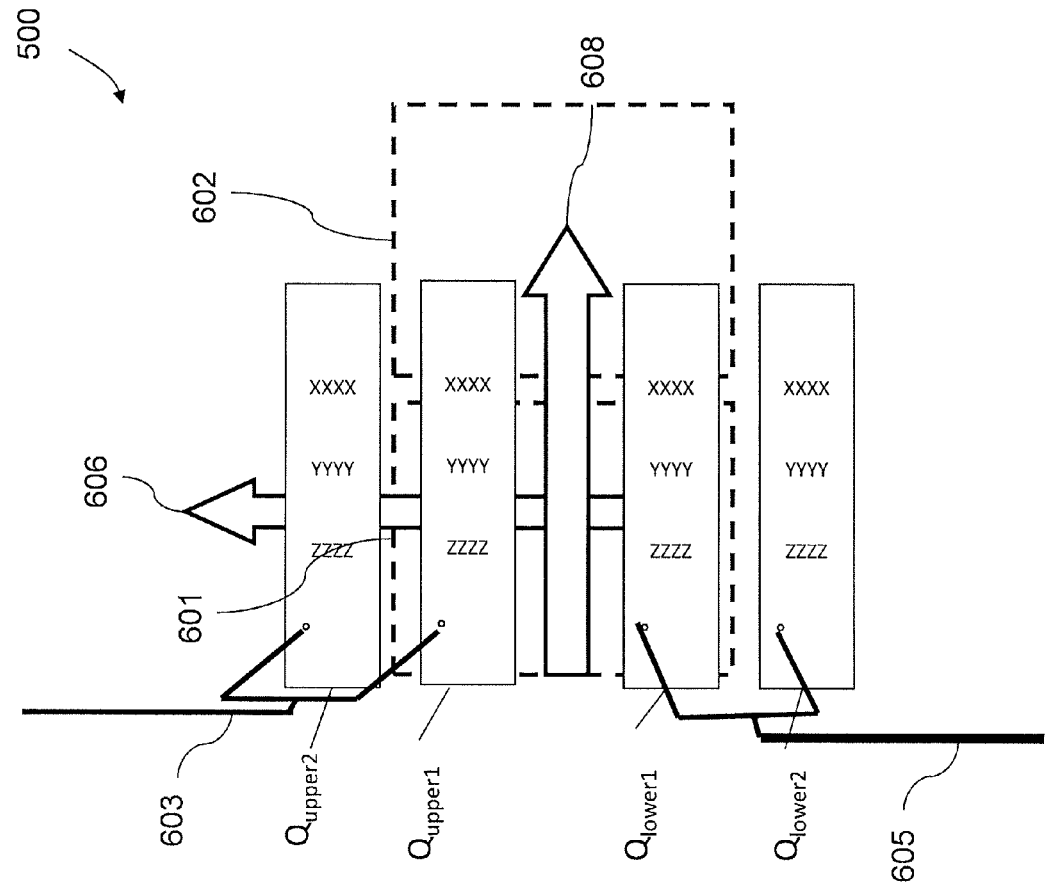
FIG. 7 shows a layout of a semiconductor switching circuit, in accordance with embodiments described herein.

FIG. 7 shows one embodiment of a layout of a transistor circuit 500 for reducing the undesirable effects of common source inductance (CSI) in parallel devices. Circuit 500 may be, for example, a semiconductor switching circuit that includes parallel upper transistor devices $Q_{upper1}$, $Q_{upper2}$ and parallel lower transistor devices $Q_{lower1}$, and $Q_{lower2}$, arranged in a half-bridge configuration. Transistor devices $Q_{upper1}$, $Q_{upper2}$, $Q_{lower1}$, $Q_{lower2}$ can be formed on a top surface of a printed circuit board (PCB), and are arranged vertically widthwise from one another with the same orientation. Circuit 500 includes first and second supply decoupling elements 601, 602, which can be formed on a bottom side of the PCB.

Circuit 500 also includes respective upper and lower gate driver transfer lines 603, 605. In circuit 500, gate driver transfer lines 603, 605 are perpendicular to the respective upper set of transistor devices $Q_{upper1}$, $Q_{upper2}$ and lower set of transistor devices $Q_{lower1}$, and $Q_{lower2}$. Output current path 608 runs in a lengthwise direction to the transistor devices $Q_{upper1}$, $Q_{upper2}$, $Q_{lower1}$, $Q_{lower2}$ of circuit 500. Circuit 500 provides a 90° (i.e., perpendicular) spatial separation between the respective output current path 608 (which may be, for example, a source-to-drain current path) and common source inductance current path 606 which is common to the gate current path. The spatial separation between a common source inductance current path 606 and output current path 608 decouples the common source inductance current path 606 from the output current path 608, thereby increasing immunity of circuit 500 to variation on the gate voltage experienced due to transient currents causing a voltage on the common source inductance. Transistor devices $Q_{upper1}$, $Q_{upper2}$, $Q_{lower1}$, $Q_{lower2}$ of circuit 500 are arranged such that the respective gates of the transistor devices are electrically close to one another. For example, the gates are arranged such that a distance between respective gates is less than three times the distance of the smallest physical dimension of the transistor devices $Q_{upper1}$, $Q_{upper2}$, $Q_{lower1}$, $Q_{lower2}$ of circuit 500. For example, the distance between the respective gates of $Q_{upper1}$ and $Q_{upper2}$, may be less than three times the magnitude of the shorter of the width or length of one of $Q_{upper1}$ or $Q_{upper2}$. Alternatively, traces that are wider than the width of the gate pad of the respective transistor device may be used to also yield electrically close connections at the gates of the respective transistor devices.

FIG. 8A illustrates a top view of the design layout of transistor circuit 500, showing current loops 611-618 within circuit 500. As shown in FIG. 8A, first and second upper transistor devices $Q_{upper1}$ and $Q_{upper2}$ and first and second lower transistor devices $Q_{lower1}$ and $Q_{lower2}$ are arranged widthwise to one another, respectively, with upper first side supply-to-load current loop 615, upper first side return-to-load current loop 616, lower second side supply-to-load current loop 617, and lower second side return-to-load current loop 618 flowing perpendicular to the upper switch inter-device current loop 611, the lower switch inter-device current loop 612, and the first and second side supply decoupling current loops 613, 614. First side supply-to-load current loop 615, first side return-to-load current loop 617, second side supply-to-load current loop 616 and second side return-to-load current loop 618 form the switch output current 608.

Figure 8B:
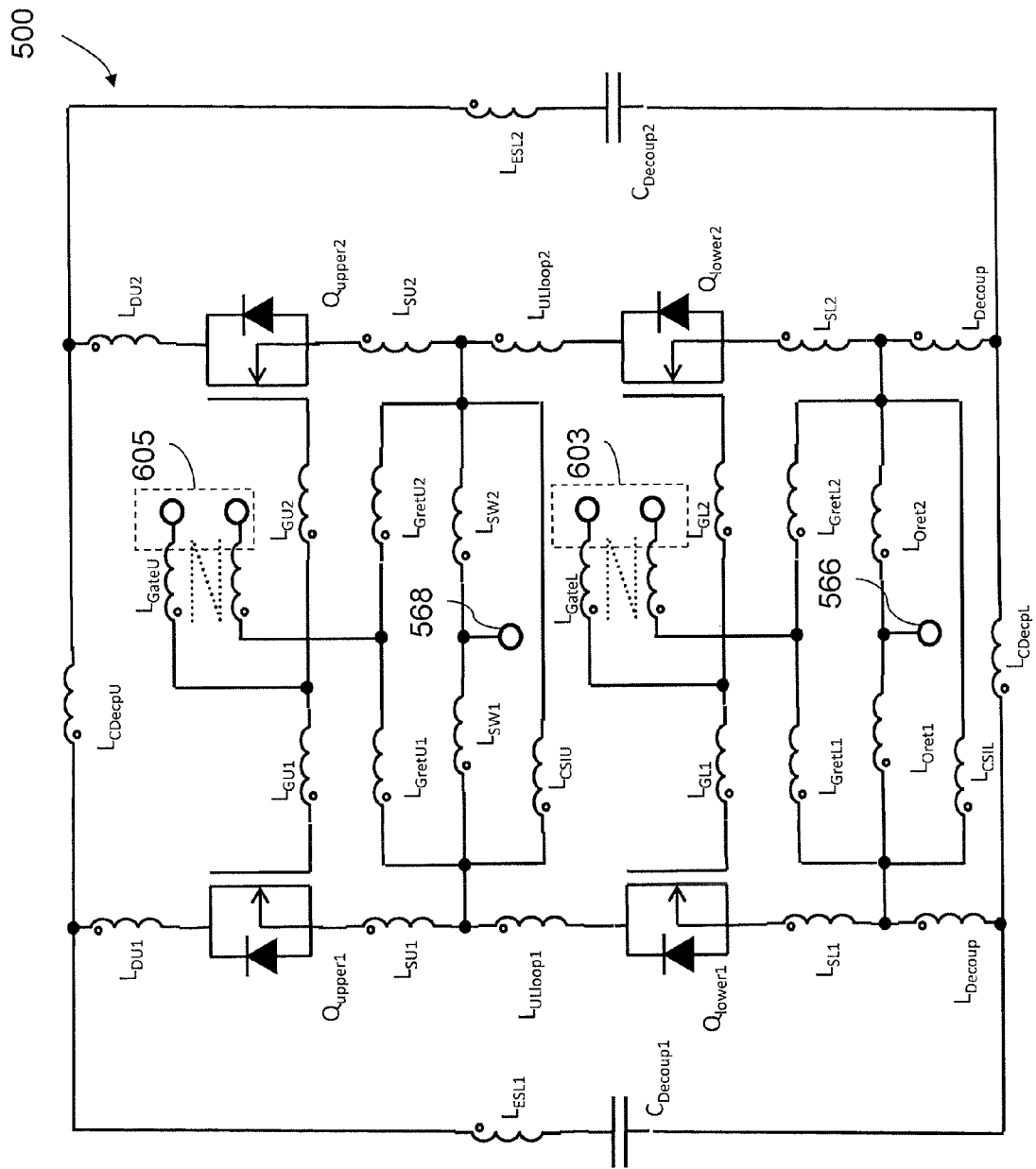
FIG. 8B shows a schematic view of a semiconductor switching circuit, in accordance with embodiments described herein.

FIG. 8B illustrates a schematic view of transistor circuit 500. Circuit 500 includes a switch output connection 568 through which a drain-source current is output from circuit 200, and a gate return connection 566. Circuit 500 also includes connections to gate transfer control lines 603, 605.

Upper transistor devices $Q_{upper1}$ and $Q_{upper2}$ include respective parasitic drain inductances $L_{DU1}$ and $L_{DU2}$, respective parasitic gate inductances $L_{GU1}$ and $L_{GU2}$, and respective parasitic source inductances $L_{SU1}$ and $L_{SU2}$. Upper transistor devices $Q_{upper1}$ and $Q_{upper2}$ also include respective gate return inductances $L_{GretU1}$ and $L_{GretU2}$ between their respective sources and drains. Upper transistor devices $Q_{upper1}$ and $Q_{upper2}$ share a common source inductance $L_{CSIU}$. In addition, upper transistor devices $Q_{upper1}$ and $Q_{upper2}$ share a common gate inductance $L_{GateU}$. A parasitic inter-connection inductance $L_{CDeepU}$ is included between the respective drains of $Q_{upper1}$ and $Q_{upper2}$.

Lower transistor devices $Q_{lower1}$ and $Q_{lower2}$ include respective parasitic source inductances $L_{SL1}$ and $L_{SL2}$, and respective parasitic gate inductances $L_{GL1}$ and $L_{GL2}$. Lower transistor devices $Q_{lower1}$ and $Q_{lower2}$ also include respective gate return inductances $L_{GretL1}$ and $L_{GretL2}$ between their respective sources and drains. Lower transistor devices $Q_{lower1}$ and $Q_{lower2}$ share a common source inductance $L_{CSIL}$. In addition, lower transistor devices $Q_{lower1}$ and $Q_{upper2}$ share a common gate inductance $L_{GateL}$. A parasitic inter-connection inductance $L_{CDeepL}$ is included between the respective sources of $Q_{upper1}$ and $Q_{upper2}$.

Other elements shown in FIG. 8B include the respective capacitances $C_{Decoup1}$, $C_{Decoup2}$ of supply decoupling elements 601, 602, as well as respective parasitic equivalent series inductances $L_{ESL1}$, $L_{ESL2}$ for supply decoupling elements 601, 602. Circuit 500 also includes the respective inductances between the first and second upper and lower loops $L_{ULloop1}$, $L_{ULloop2}$, and the ground decoupling connection inductance of lower transistor devices $L_{Decoup}$. Circuit 500 also includes respective parasitic inductances $L_{SW1}$, $L_{SW2}$ for the first and second sides' connection to the switch output connection 568, and respective parasitic inductances $L_{Oret1}$, $L_{Oret2}$ for the first and seconds sides' connection to the switch return connection 566.

Figure 9A:
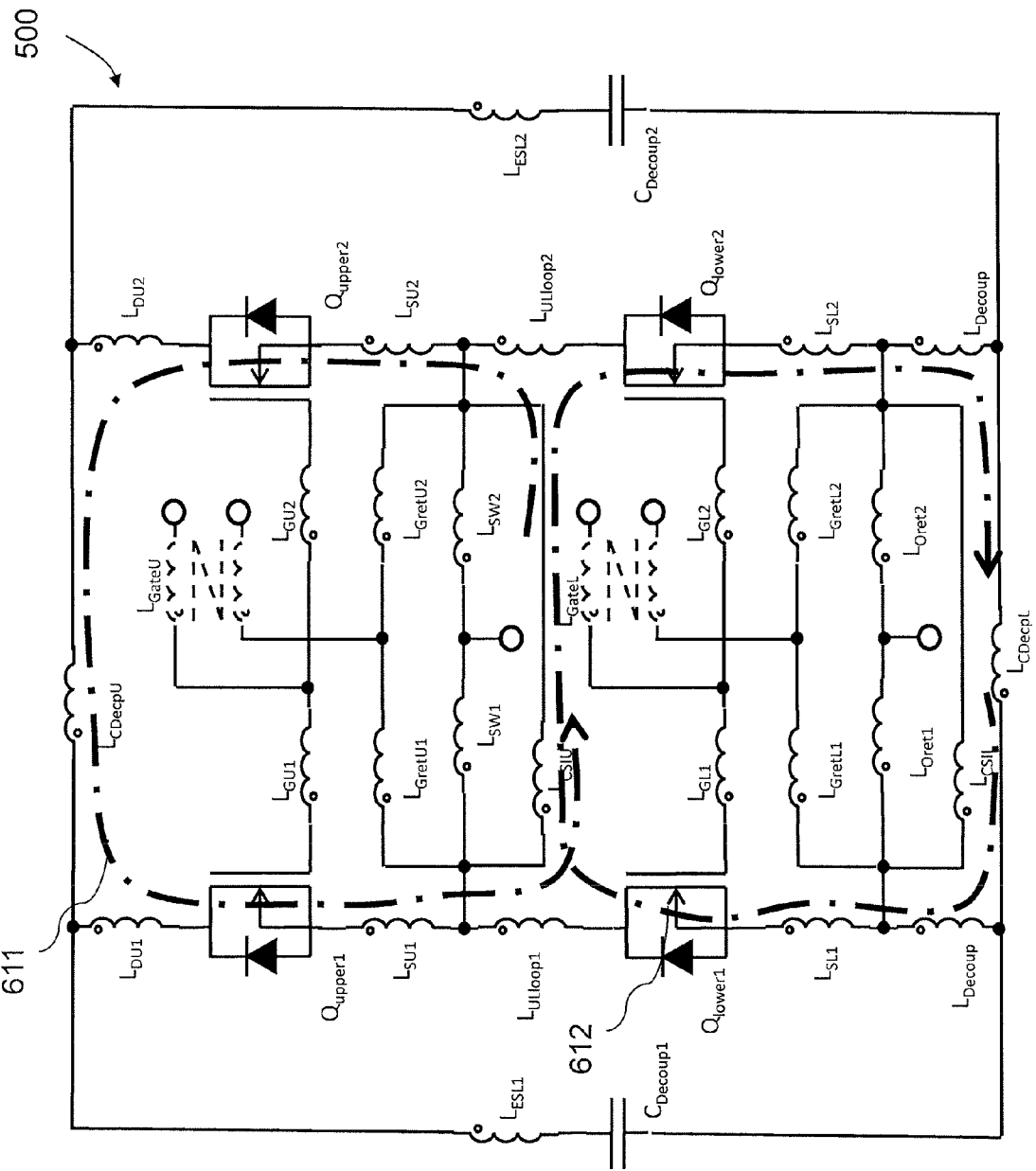
FIGS. 9A-9D show a schematic view of current loops within a semiconductor switching circuit, in accordance with embodiments described herein.
Figure 9B:
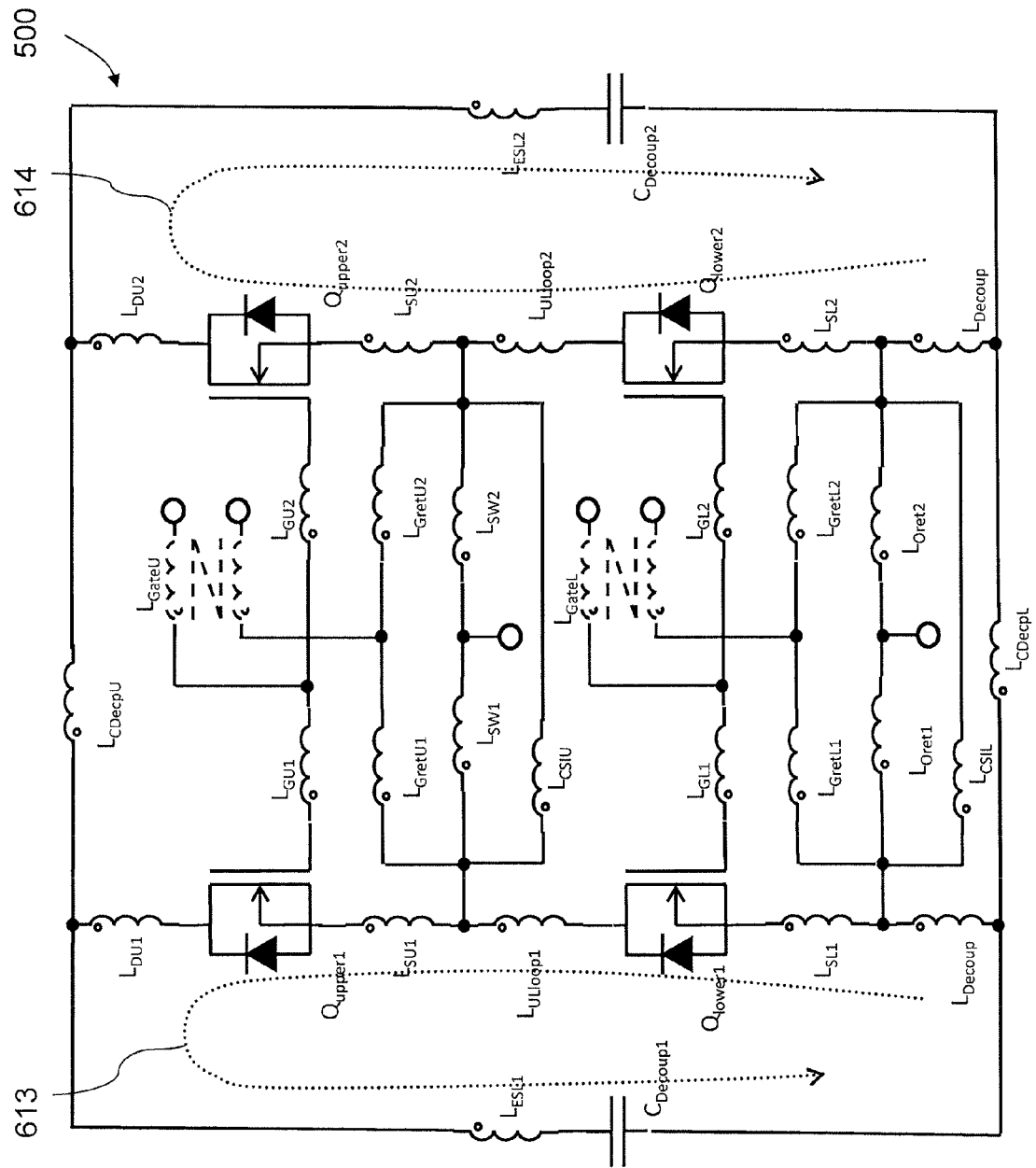

FIGS. 9A-9D illustrate the current loops 611-618 on the schematic representation of circuit 500 in FIG. 8B. FIG. 9A shows upper switch inter-device current loop 611 representing the path that current travels within the upper set of parallel of transistor devices $Q_{upper1}$ and $Q_{upper2}$, and lower switch inter-device current loop 612 representing the path that current travels within the lower parallel sets of transistors $Q_{lower1}$ and $Q_{lower2}$. FIG. 9B shows respective first and second side supply decoupling current loops 613, 614, representing the respective paths that current travels between supply decoupling element 601 (FIG. 8A) and the set of first side transistors $Q_{lower1}$ and $Q_{upper1}$ and between supply decoupling element 602 (FIG. 8A) and the set of second side transistors $Q_{lower2}$ and $Q_{upper2}$.

Figure 9C:
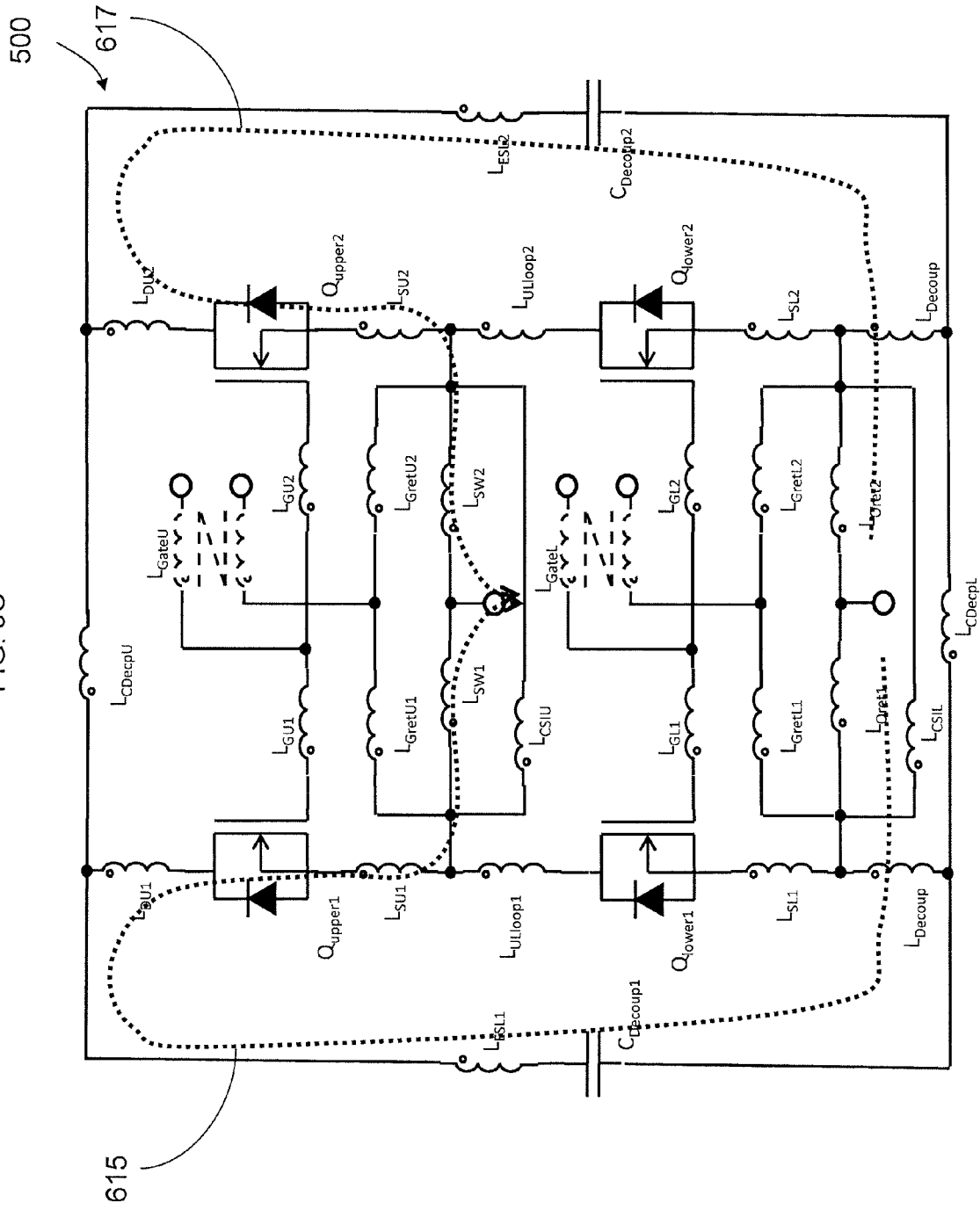
Figure 9D:
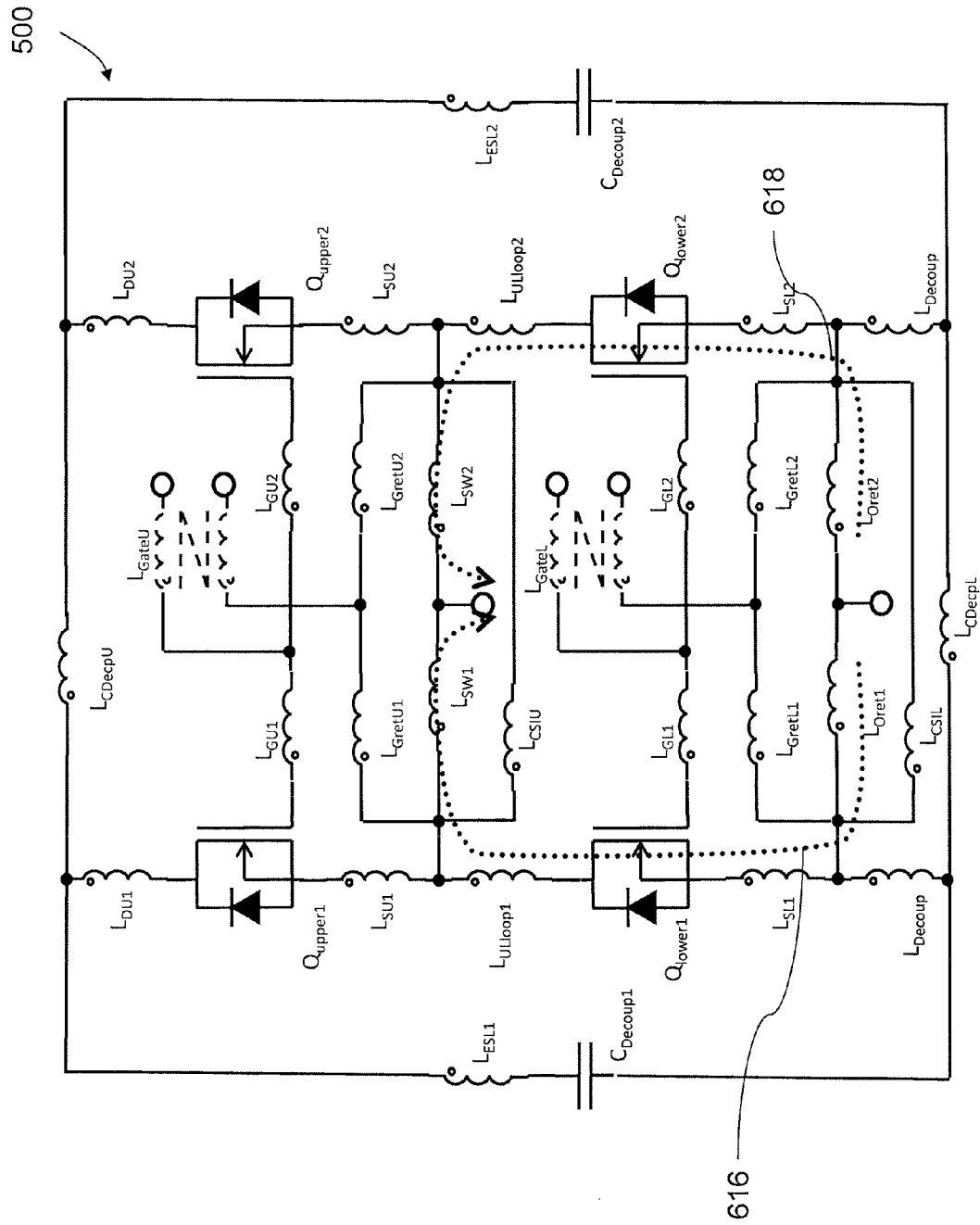

FIG. 9C shows a first side supply-to-load current loop 615, representing the path that current takes from first side upper transistor device $Q_{upper1}$ to switch output node 568, and second side supply-to-load current loop 617, representing the path that current takes from second side upper transistor device $Q_{upper2}$ to switch output node 568. FIG. 9D shows a first side return-to-load current loop 616, representing the path that current takes from first side lower transistor device $Q_{lower1}$ to switch output node 568, and a second side return-to-load current loop 618, representing the path that current takes from second side lower transistor device $Q_{lower1}$ to switch output node 568.

As shown in FIG. 9C, first side supply-to-load current loop 615 from first side upper transistor device $Q_{upper1}$ and second side supply-to-load current loop 617 from second side upper transistor device $Q_{upper2}$ are balanced across opposite sides of circuit 500. Similarly, as shown in FIG. 9D, return-to-load current loop 616 from first side lower transistor device $Q_{lower1}$ and second side supply-to-load current loop 617 from second side upper transistor device $Q_{upper2}$ are balanced across opposite sides of circuit 500. Accordingly, the main output current for circuit 500 (e.g., the current in output current path 608) will flow in opposite directions at the same time, thereby balancing any voltage that results from variations in current di/dt across the common source of circuit 500. Although some imbalance between di/dt induced voltages may remain, the resultant voltage will be significantly smaller than in conventional arrangements. As shown in both FIGS. 9C and 9D, the respective voltages generated in each of inductances $L_{SW1}$ and $L_{SW2}$ will essentially have the same magnitude, given the same values of $L_{SW1}=L_{SW2}$ by geometric symmetry of the layout and assumed current sharing from each of the loops 615 and 617 (FIG. 9C) and loops 616 and 618 (FIG. 9D). The total voltage across both inductances $L_{SW1}$ and $L_{SW2}$ will then equate to zero, thereby ensuring that the output current is decoupled from the common source inductance of each of the devices.

Figure 10A:
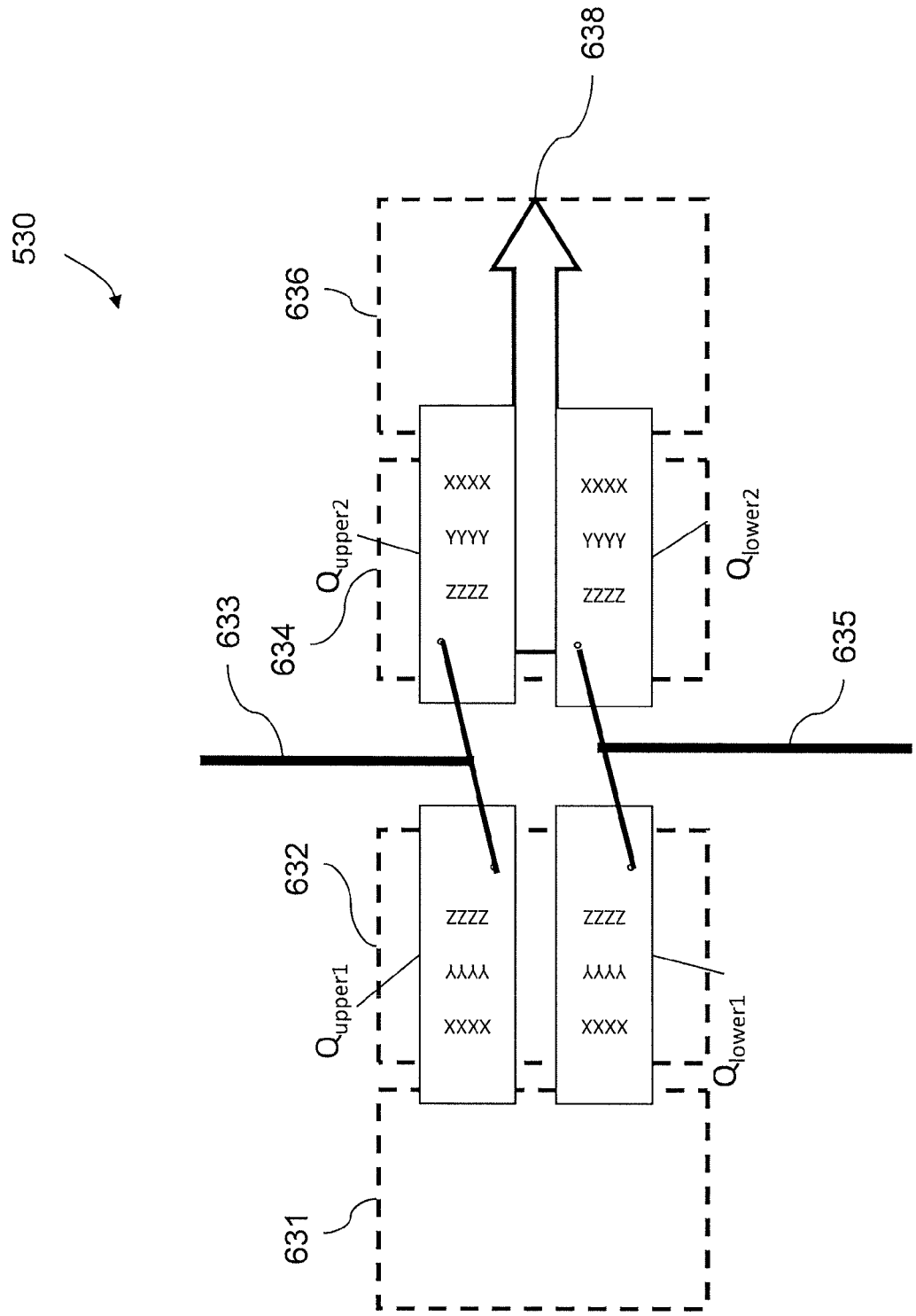
FIGS. 10A-10C show layout views of semiconductor switching circuits, in accordance with embodiments described herein.
Figure 10B:
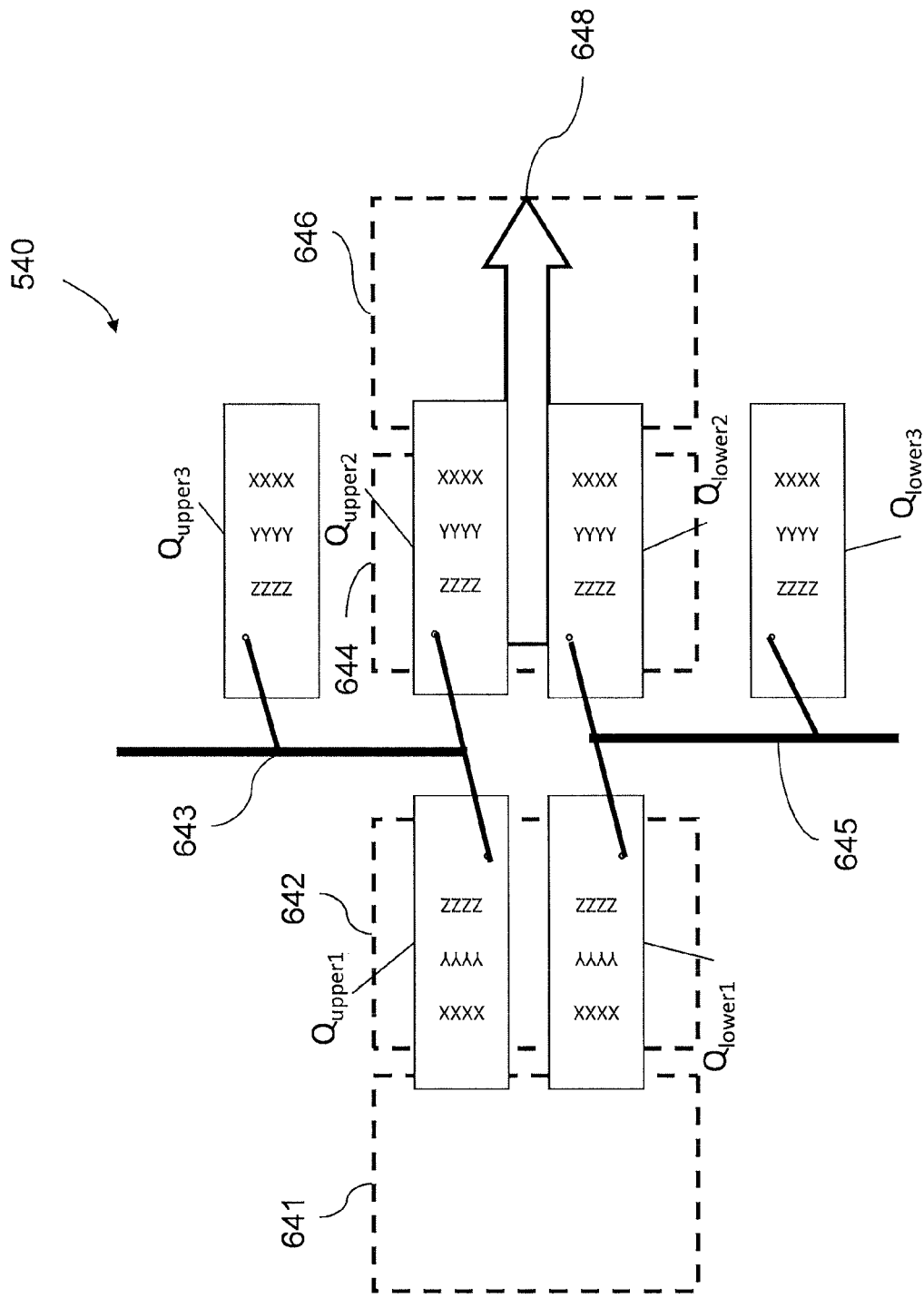
Figure 10C:
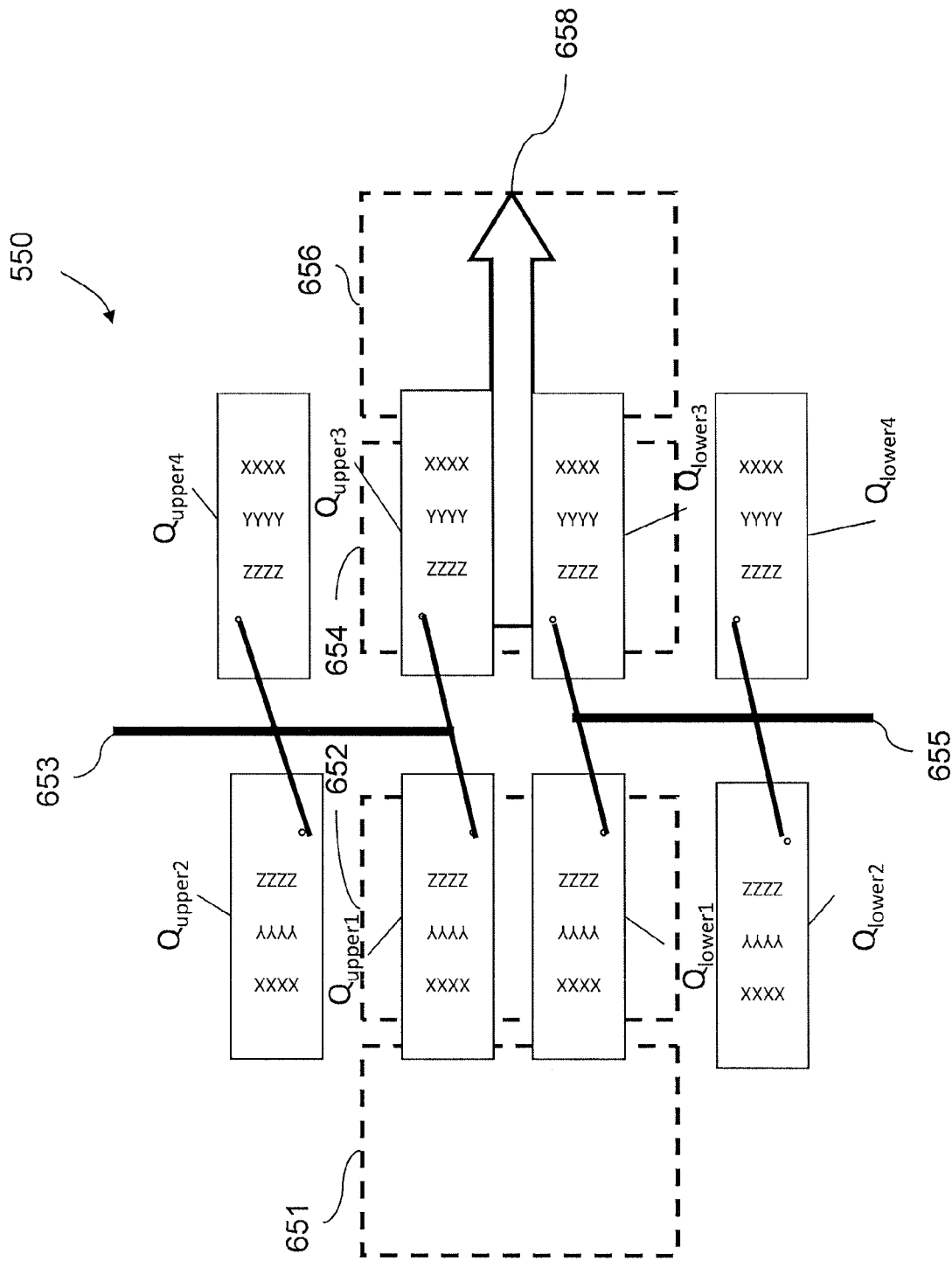

FIGS. 10A-10C illustrates variations on the design shown in FIG. 7 for circuits including different numbers of transistors devices with electrically close gate connections.

In FIG. 10A, circuit 530 includes two paralleled upper transistor devices $Q_{upper1}$, $Q_{upper2}$, and two paralleled lower transistor devices $Q_{lower1}$, and $Q_{lower2}$. Unlike in circuit 500 of FIG. 7, however, paralleled upper transistor devices $Q_{upper1}$, $Q_{upper2}$ are arranged lengthwise to one another with opposite orientations, as are paralleled lower transistor devices $Q_{lower1}$ and $Q_{lower2}$. Gate driver transfer line 633 is commonly coupled to the gates of first and second upper transistor devices $Q_{upper1}$, $Q_{upper2}$ in a T structure configuration, and gate transfer line 635 is commonly coupled to the gates of first and second lower transistor devices $Q_{lower1}$, $Q_{lower2}$ in another T structure configuration. Two supply decoupling elements 631, 632 corresponding to first side transistor devices $Q_{upper1}$, $Q_{lower1}$ are located on a bottom side of a PCB, and two supply decoupling elements 634, 636 corresponding to second side transistor devices $Q_{upper2}$, $Q_{lower2}$ are located on the bottom side of the PCB. An output current path 638 runs lengthwise the devices in circuit 530.

In FIG. 10B, circuit 540 includes three paralleled upper transistor devices $Q_{upper1}$, $Q_{upper2}$, $Q_{upper3}$, and three paralleled lower transistor devices $Q_{lower1}$, $Q_{lower2}$, $Q_{lower3}$. Paralleled upper transistor devices $Q_{upper1}$, $Q_{upper2}$, $Q_{upper3}$ are arranged lengthwise to one another, as are paralleled lower transistor devices $Q_{lower1}$, $Q_{lower2}$, $Q_{lower3}$. Gate driver transfer line 643 is commonly coupled to the gates of first, second, and third upper transistor devices $Q_{upper1}$, $Q_{upper2}$, $Q_{upper3}$ in an H structure configuration, and gate transfer line 645 is commonly coupled to the gates of first, second, and third lower transistor devices $Q_{lower1}$, $Q_{lower2}$, $Q_{lower3}$ in another H structure configuration. Two supply decoupling elements 641, 642 corresponding to first side transistor devices $Q_{upper1}$, $Q_{lower1}$ are located on a bottom side of a PCB, and two supply decoupling elements 644, 646 corresponding to second and third side transistor devices $Q_{upper2}$, $Q_{lower2}$, $Q_{upper3}$, $Q_{lower3}$ are located on the bottom side of the PCB. An output current path 648 runs lengthwise the devices in circuit 540.

In FIG. 10C, circuit 550 includes four paralleled upper transistor devices $Q_{upper1}$, $Q_{upper2}$, $Q_{upper3}$, $Q_{upper4}$, and four paralleled lower transistor devices $Q_{lower1}$, $Q_{lower2}$, $Q_{lower3}$, $Q_{lower4}$. Paralleled upper transistor devices $Q_{upper1}$, $Q_{upper2}$, $Q_{upper3}$, $Q_{upper4}$ are arranged lengthwise to one another, as are paralleled lower transistor devices $Q_{lower1}$, $Q_{lower2}$, $Q_{lower3}$, $Q_{lower4}$. Gate driver transfer line 653 is commonly coupled to the gates of first, second, third, and fourth upper transistor devices $Q_{upper1}$, $Q_{upper2}$, $Q_{upper3}$, $Q_{upper4}$ in an H structure configuration, and gate transfer line 655 is commonly coupled to the gates of first, second, third, and fourth lower transistor devices $Q_{lower1}$, $Q_{lower2}$, $Q_{lower3}$, $Q_{lower4}$ in another H structure configuration. Two supply decoupling elements 651, 652 corresponding to first and second side transistor devices $Q_{upper1}$, $Q_{lower1}$, $Q_{upper2}$, $Q_{lower2}$ are located on a bottom side of a PCB, and two supply decoupling elements 654, 656 corresponding to third and fourth side transistor devices $Q_{upper3}$, $Q_{lower3}$, $Q_{upper4}$, $Q_{lower4}$ are located on the bottom side of the PCB. An output current path 658 runs lengthwise the devices in circuit 550.

Figure 11:
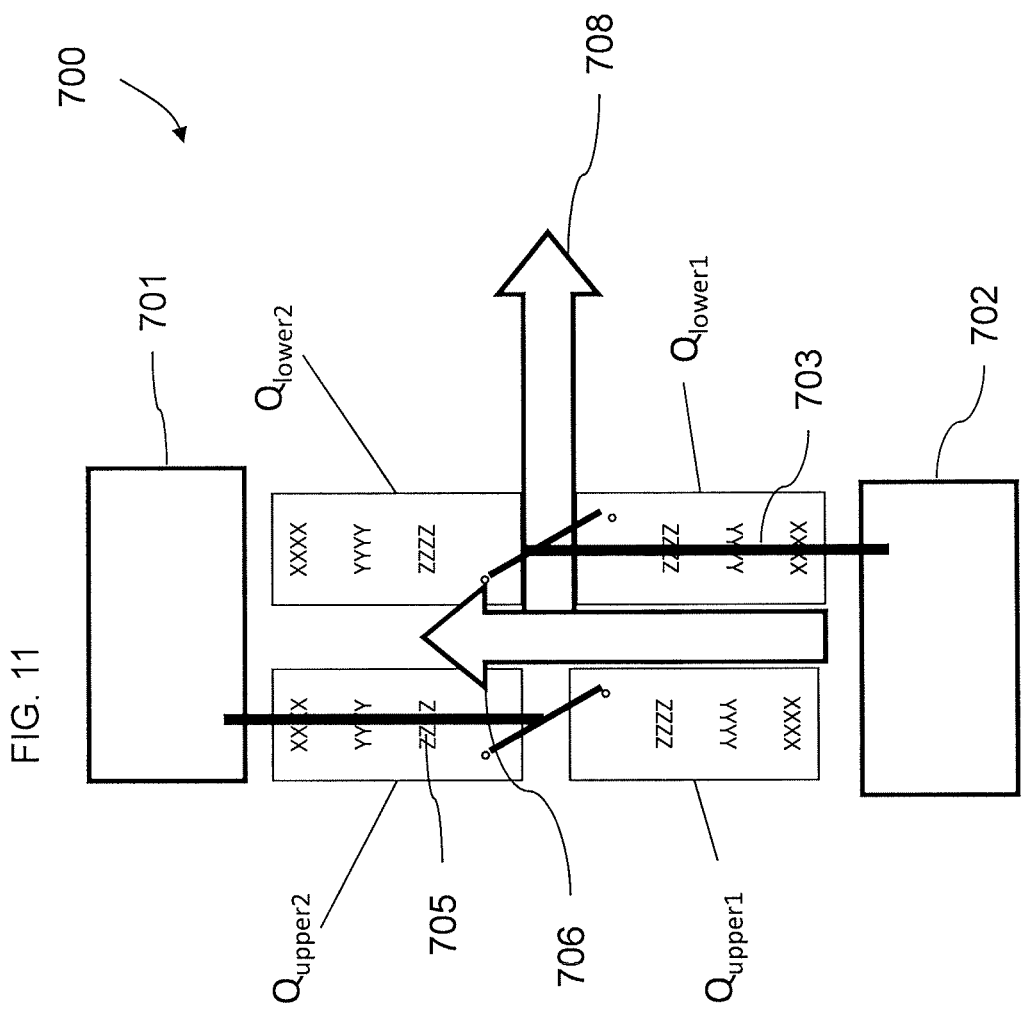
FIG. 11 shows a layout of a semiconductor switching circuit, in accordance with embodiments described herein.

FIG. 11 illustrates another layout design for a circuit 700 including paralleled transistor devices $Q_{upper1}$, $Q_{lower1}$, $Q_{upper2}$, $Q_{lower2}$ with electrically close gate connections. Paralleled upper transistor devices $Q_{upper1}$, $Q_{upper2}$ are arranged on a first side of circuit 700, and paralleled lower transistor devices $Q_{lower1}$, $Q_{lower2}$ are arranged on a second side, with upper transistor devices $Q_{upper1}$, $Q_{upper2}$ arranged widthwise to lower transistor devices $Q_{lower1}$, $Q_{lower2}$. First and second supply decoupling elements 701, 702 are arranged on the same side of a PCB as the transistor devices $Q_{upper1}$, $Q_{lower1}$, $Q_{upper2}$, $Q_{lower2}$. Respective upper and lower gate driver transfer lines 703, 705 run perpendicular to the respective upper set of transistor devices $Q_{upper1}$, $Q_{upper2}$ and lower set of transistor devices $Q_{lower1}$, and $Q_{lower2}$. An output current path 708 runs in a widthwise direction to the transistor devices $Q_{upper1}$, $Q_{lower1}$, $Q_{upper2}$, $Q_{lower2}$ of circuit 700. Circuit 700 provides a 90° (i.e., perpendicular) spatial separation between the respective output current path 708 (which may be, for example, a source-to-drain current path) and the inter-device inductance current direction 706.

Figure 12:
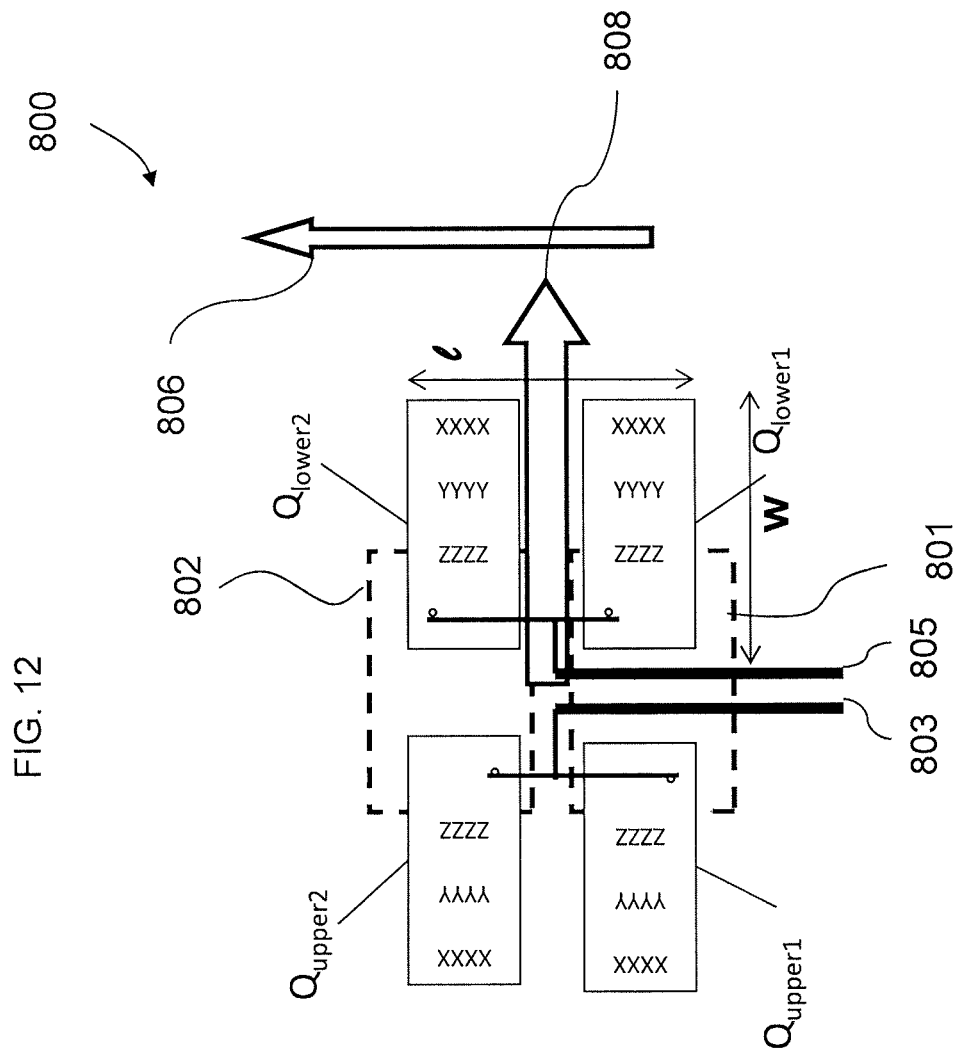
FIG. 12 shows a layout of a semiconductor switching circuit, in accordance with embodiments described herein.

FIG. 12 illustrates another layout design for a circuit 800 including paralleled transistor devices $Q_{upper1}$, $Q_{lower1}$, $Q_{upper2}$, $Q_{lower2}$ with electrically close gate connections. In circuit 800, transistor devices $Q_{upper1}$, $Q_{lower1}$, $Q_{upper2}$, $Q_{lower2}$ are located on a top side of a PCB, while supply decoupling elements 801, 802 are located on a bottom side of the PCB. Upper and lower gate driver transfer lines 803, 805 are perpendicular to the respective upper set of transistor devices $Q_{upper1}$, $Q_{upper2}$ and lower set of transistor devices $Q_{lower1}$, $Q_{lower2}$. An output current path 808 runs in a lengthwise direction to the transistor devices in circuit 800. Circuit 800 provides a 90° (i.e., perpendicular) spatial separation between the respective output current path 808 (which may be, for example, a source-to-drain current path) and the inter-device inductance current direction 806. Preferably, circuit 800 maintains a width w spanning from gate driver transfer lines 803, 805 to an output node that is greater than a length l spanning parallel transistors (e.g., $Q_{lower1}$ and $Q_{lower2}$). Maintaining this configuration provides a lower inter-device source inductance for circuit 800.

Figure 13:
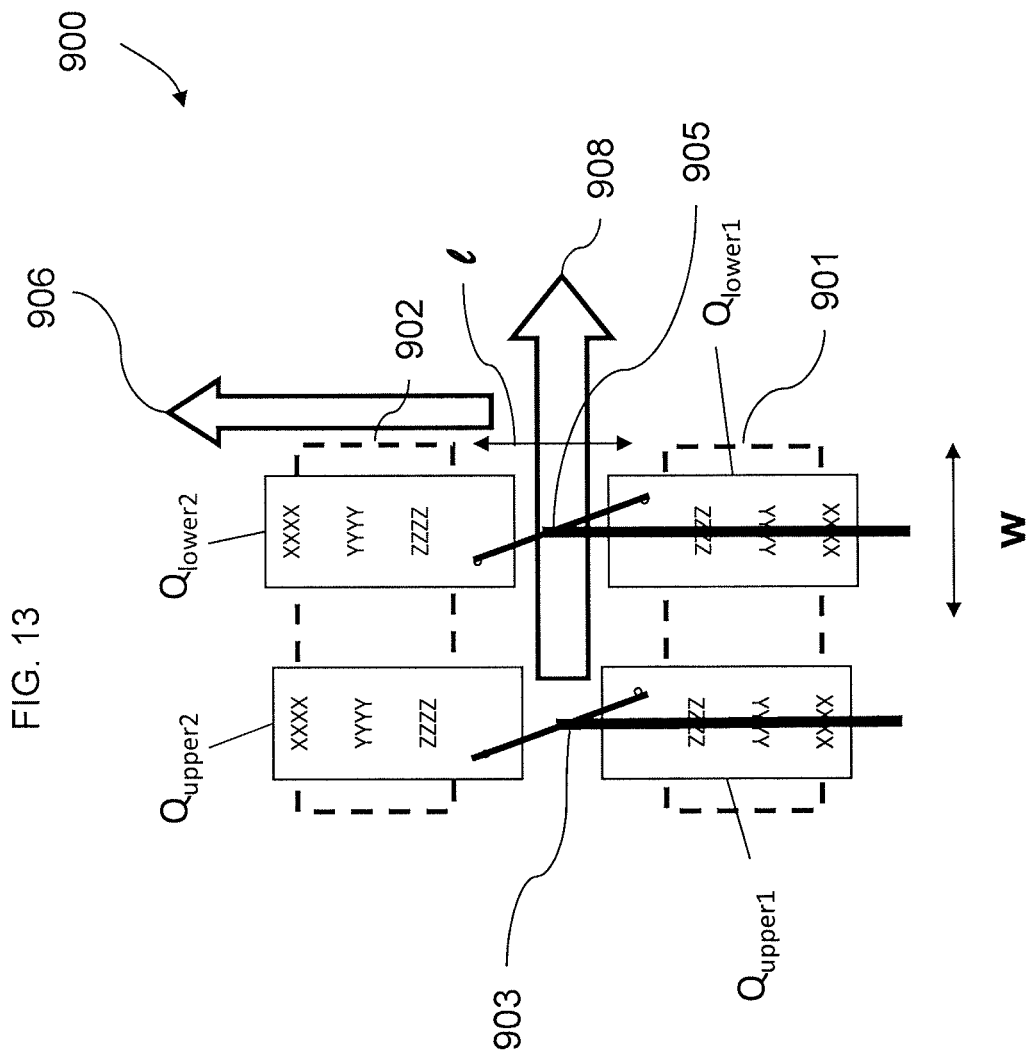
FIG. 13 shows a layout of a semiconductor switching circuit, in accordance with embodiments described herein.

FIG. 13 illustrates another layout design for a circuit 900 including paralleled transistor devices $Q_{upper1}$, $Q_{lower1}$, $Q_{upper2}$, $Q_{lower2}$ with electrically close gate connections. As in circuit 700 of FIG. 11, paralleled upper transistor devices $Q_{upper1}$, $Q_{upper2}$ are arranged on a first side of circuit 700, and paralleled lower transistor devices $Q_{lower1}$, $Q_{lower2}$ are arranged on a second side, with upper transistor devices $Q_{upper1}$, $Q_{upper2}$ arranged widthwise to lower transistor devices $Q_{lower1}$, $Q_{lower2}$. In circuit 900, however, transistor devices $Q_{upper1}$, $Q_{lower1}$, $Q_{upper2}$, $Q_{lower2}$ are located on a top side of a PCB, while supply decoupling elements 901, 902 are located on a bottom side of the PCB. Upper and lower gate driver transfer lines 903, 905 run parallel to the respective upper set of transistor devices $Q_{upper1}$, $Q_{upper2}$ and lower set of transistor devices $Q_{lower1}$, and $Q_{lower2}$. The output current path 908 runs in a widthwise direction to circuit 900. Circuit 900 provides a 90° (i.e., perpendicular) spatial separation between the respective output current path 908 (which may be, for example, a source-to-drain current path) and the inter-device inductance current direction 906. Preferably, circuit 900 maintains a width w that is greater than a length l, in order to provide a lower inter-device source inductance for circuit 900.

Figure 14:
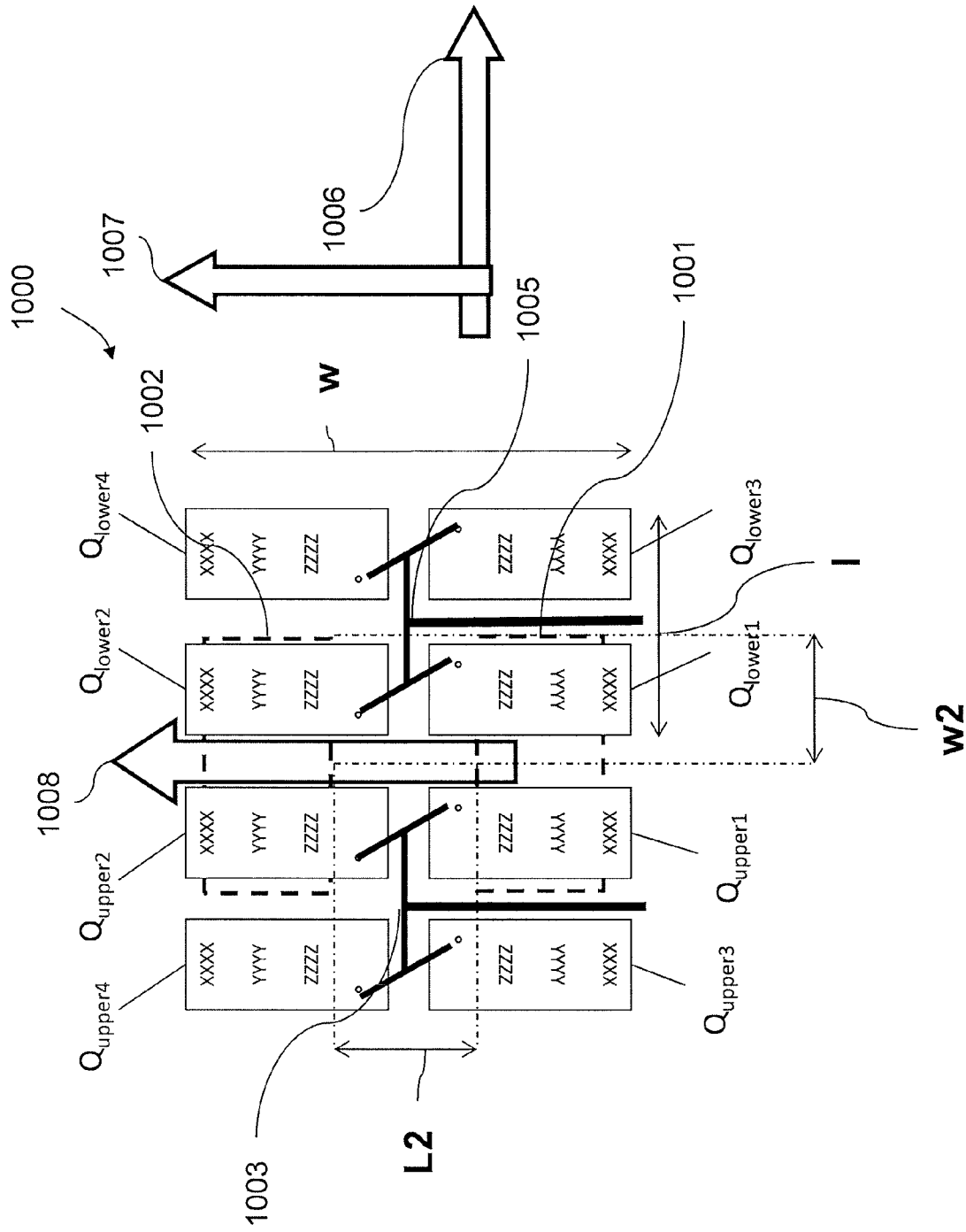
FIG. 14 shows a layout of a semiconductor switching circuit, in accordance with embodiments described herein.

FIG. 14 illustrates another layout design for a circuit 1000 including paralleled transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$. In circuit 1000, paralleled upper transistors $Q_{upper1}$, $Q_{upper2}$, $Q_{upper3}$, $Q_{upper4}$, and paralleled lower transistors $Q_{lower1}$, $Q_{lower2}$, $Q_{lower3}$, $Q_{lower4}$, are located on a top side of a PCB, while supply decoupling elements 1001, 1002 are located on a bottom side of the PCB. Circuit 1000 includes respective upper and lower gate driver transfer lines 1003, 1005 that form electrically close gate connections. The commonly-connected gates of paralleled upper transistors $Q_{upper1}$, $Q_{upper2}$, $Q_{upper3}$, $Q_{upper4}$ are coupled using a Y-T structure, as are the commonly-connected gates of paralleled lower transistors $Q_{lower1}$, $Q_{lower2}$, $Q_{lower3}$, $Q_{lower4}$.

Three current paths 1006, 1007, 1008 are shown in FIG. 14. An output current path 1008 flows lengthwise to transistor devices in circuit 1000. A first inter-device current path 1006 flows width-wise to transistor devices in circuit 1000, and at a 90° (i.e., perpendicular) angle to the output current path 1008. A second inter-device current 1007 flows parallel to the output current path 1008. In one embodiment, a first width w is greater than a first length l. In another embodiment, a second width w2 that is greater than the second length l2.

If, in circuit 1000, a lower source inductance is yielded by the first embodiment (i.e., with a first width w that is greater than a first length l), then first inter-device current path 1006 corresponds to output current path 1008. If, however, a lower source inductance is yielded by the second embodiment (i.e., a second width w2 that is greater than the second length l2), then current path 1006 would effectively become the output current path, and inter-device current path 1007 represents the source inductance path.

Figure 15A:
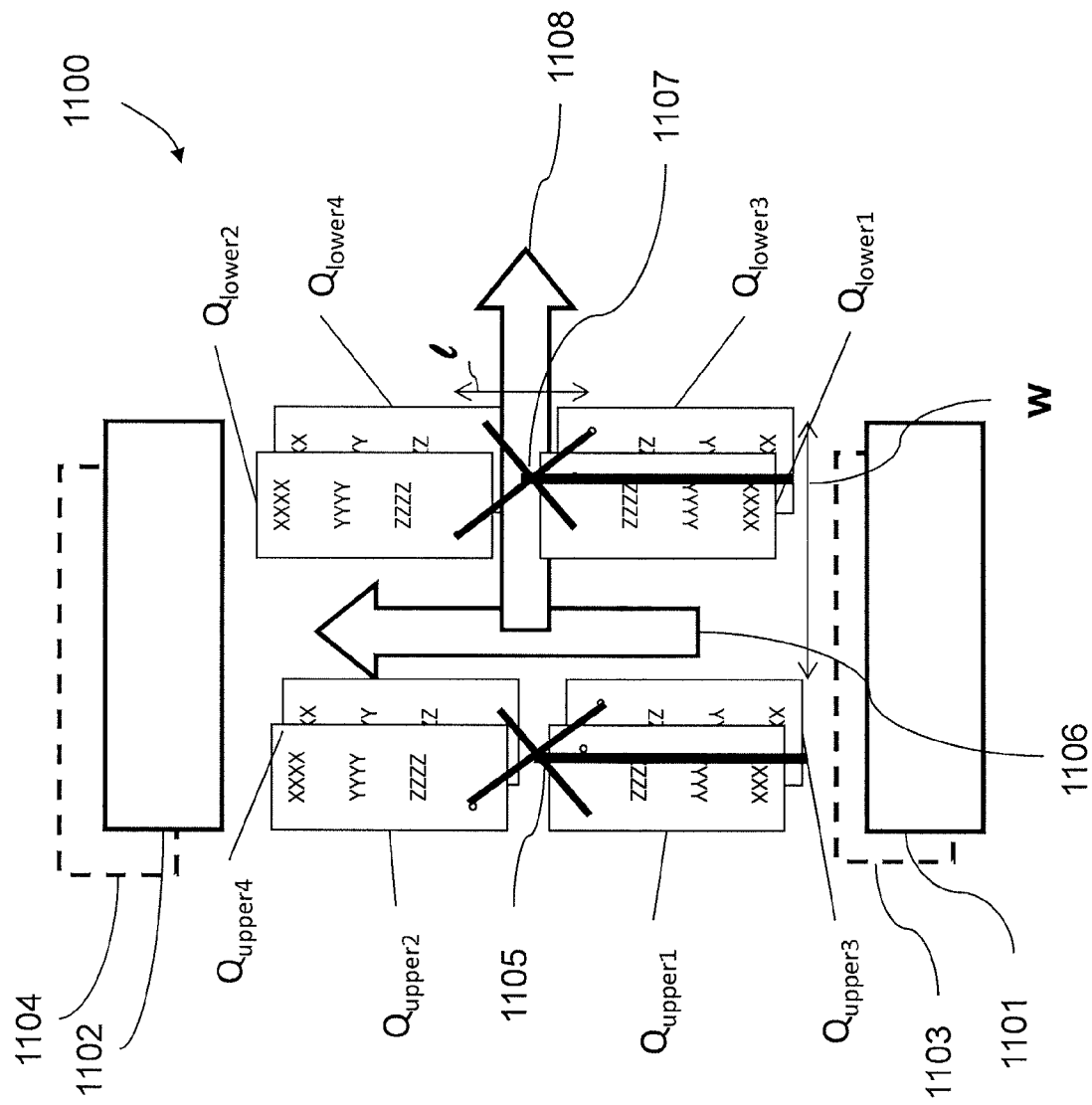
FIG. 15A shows a layout of a semiconductor switching circuit, in accordance with embodiments described herein.

FIG. 15A illustrates another layout design for a circuit 1100 including paralleled transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$. In circuit 1100, for paralleled upper transistors $Q_{upper1}$, $Q_{upper2}$, $Q_{upper3}$, $Q_{upper4}$, a first set of upper transistors (e.g., $Q_{upper1}$, $Q_{upper2}$) are located on a top side of a PCB, and a second set of upper transistors (e.g., $Q_{upper3}$, $Q_{upper4}$) are located on a bottom side of the PCB. Similarly, for paralleled lower transistors $Q_{lower1}$, $Q_{lower2}$, $Q_{lower3}$, $Q_{lower4}$, a first set of lower transistors (e.g., $Q_{lower1}$, $Q_{lower2}$) are located on the top side of the PCB, and a second set of upper transistors (e.g., $Q_{lower3}$, $Q_{lower4}$) are located on the bottom side of the PCB. First and second supply decoupling elements 1101, 1102 may be located on one or both sides of the PCB (e.g., first supply decoupling element 1101 may be located on the top side of the PCB, and second supply decoupling element 1102 may be located on the bottom side of the PCB. In another embodiment, first and second supply decoupling elements 1101, 1102 may be located on the top side of the PCB, and a third and a fourth supply decoupling element 1103, 1104 may be located on the bottom side of the PCB. Parallel transistors on respective sides of the PCB (e.g., $Q_{upper1}$, $Q_{upper2}$) are arranged widthwise to one another in opposing directional alignment, with the respective gate connections of the transistors on neighboring sides, to provide electrically close gate connections.

Respective upper and lower gate driver transfer lines 1105, 1107 run parallel to the length of the respective transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$. The commonly-connected gates of upper transistor devices $Q_{upper1}$, $Q_{upper2}$, $Q_{upper3}$, $Q_{upper4}$ are coupled by an x-structured connection, as are the commonly-connected gates of lower transistors $Q_{lower1}$, $Q_{lower2}$, $Q_{lower3}$, $Q_{lower4}$. An output current direction 1108 runs width-wise to transistor devices in circuit 1100, and an inter-device inductance current 1106 flows in a 90° (i.e., perpendicular) angle to the output current path 1108. Preferably, circuit 1100 maintains a width w that is greater than a length l, thereby yielding a low inductance for circuit 1100.

Figure 15B:
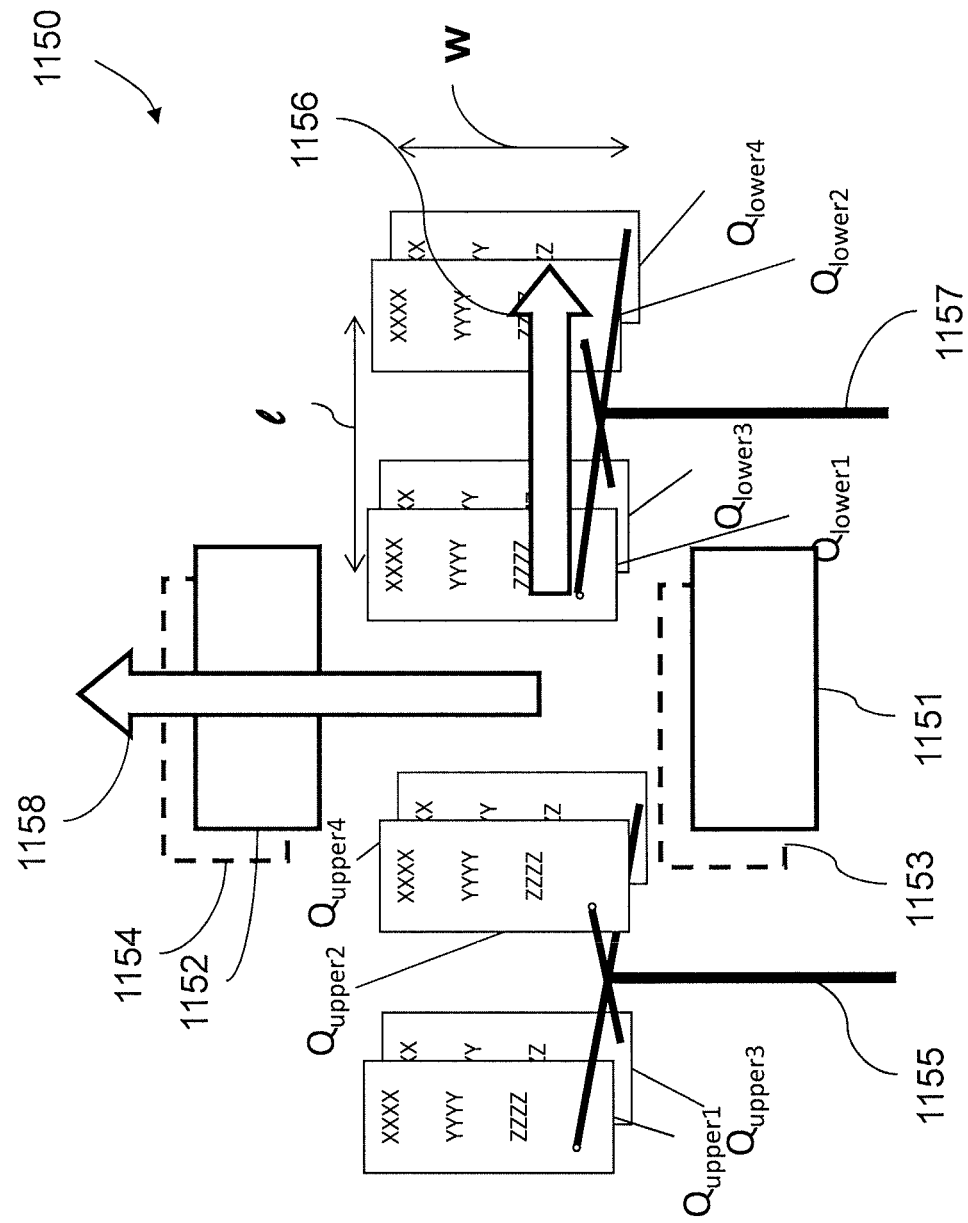
FIG. 15B shows a layout of a semiconductor switching circuit, in accordance with embodiments described herein.

FIG. 15B illustrates another layout design for a circuit 1150 including paralleled transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$. In circuit 1150, for paralleled upper transistors $Q_{upper1}$, $Q_{upper2}$, $Q_{upper3}$, $Q_{upper4}$, a first set of upper transistors (e.g., $Q_{upper1}$, $Q_{upper2}$) are located on a top side of a PCB, and a second set of upper transistors (e.g., $Q_{upper3}$, $Q_{upper4}$) are located on a bottom side of the PCB. Similarly, for paralleled lower transistors $Q_{lower1}$, $Q_{lower2}$, $Q_{lower3}$, $Q_{lower4}$, a first set of lower transistors (e.g., $Q_{lower1}$, $Q_{lower2}$) are located on the top side of the PCB, and a second set of upper transistors (e.g., $Q_{lower3}$, $Q_{lower4}$) are located on the bottom side of the PCB. Unlike circuit 1100 of FIG. 15A, in circuit 1150 of FIG. 15B, parallel transistors on respective sides of the PCB (e.g., $Q_{upper1}$, $Q_{upper2}$) are arranged lengthwise to one another in the same directional alignment, with the respective gate connections of the transistors aligned with one another, to provide electrically close gate connections.

In circuit 1150, respective upper and lower gate driver transfer lines 1155, 1157 run parallel to the length of the respective transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$. The commonly-connected gates of upper transistor devices $Q_{upper1}$, $Q_{upper2}$, $Q_{upper3}$, $Q_{upper4}$ are coupled by an x-structured connection, as are the commonly-connected gates of lower transistors $Q_{lower1}$, $Q_{lower2}$, $Q_{lower3}$, $Q_{lower4}$. An output current direction 1158 runs length-wise to transistor devices in circuit 1150, and an inter-device inductance current 1156 flows in a 90° (i.e., perpendicular) angle to the output current path 1158. Preferably, circuit 1150 maintains a width w that is greater than a length l, thereby yielding a low inductance for circuit 1150.

FIG. 16 illustrates another layout design for a circuit 1200 including paralleled transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$ with electrically close gate connections. In circuit 1200, paralleled upper transistor devices $Q_{upper1}$, $Q_{upper2}$, $Q_{upper3}$, $Q_{upper4}$ are located on a first side (e.g., a top side) of a PCB, and paralleled lower transistors $Q_{lower1}$, $Q_{lower2}$, $Q_{lower3}$, $Q_{lower4}$ are located on a second side (e.g., a bottom side) of the PCB. Circuit 1200 includes first and second supply decoupling elements 1201, 1202 on a first side of the PCB, and third and fourth supply decoupling elements 1203, 1204 on a second side of the PCB.

In circuit 1200, respective upper and lower gate driver transfer lines 1205, 1207 run perpendicular to the length of the respective transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$. The commonly-connected gates of upper transistor devices $Q_{upper1}$, $Q_{upper2}$, $Q_{upper3}$, $Q_{upper4}$ are coupled by an H-structured connection, as are the commonly-connected gates of lower transistors $Q_{lower1}$, $Q_{lower2}$, $Q_{lower3}$, $Q_{lower4}$. An output current path 1208 flows lengthwise to transistor devices in circuit 1200.

Figure 17:
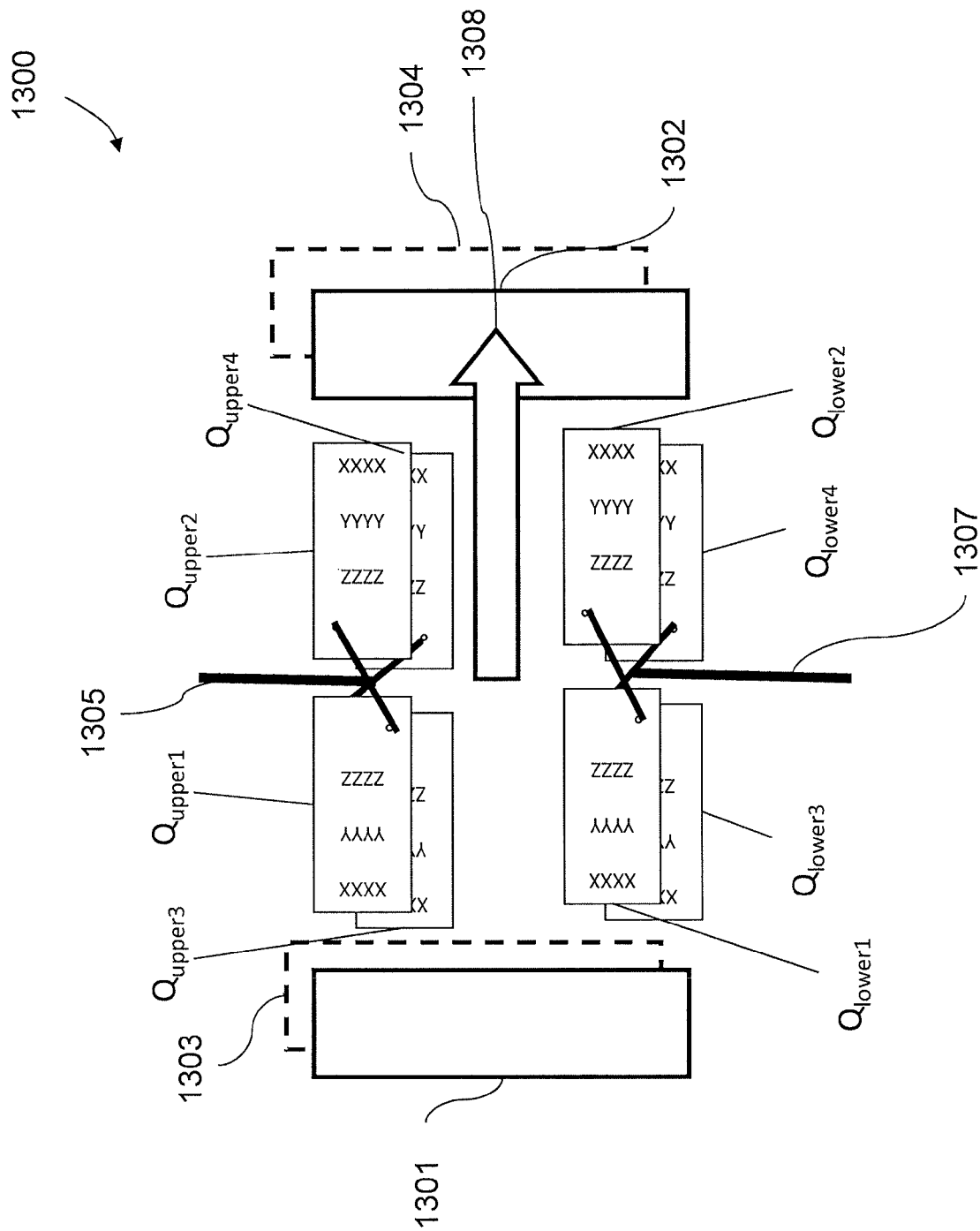
FIG. 17 shows a layout of a semiconductor switching circuit, in accordance with embodiments described herein.

FIG. 17 illustrates another layout design for a circuit 1300 including paralleled transistor devices $Q_{upper1}$, $Q_{lower1}$, $Q_{upper2}$, $Q_{lower2}$, $Q_{upper3}$, $Q_{lower3}$, $Q_{upper4}$, $Q_{lower4}$ with electrically close gate connections. In circuit 1300, a first set of upper transistor devices (e.g., first and second upper transistor devices $Q_{upper1}$, $Q_{upper2}$) and a first set of lower transistor devices (e.g., first and second lower transistor devices $Q_{lower1}$, $Q_{lower2}$) are located on a first side (e.g., a top side) of a PCB. A second set of upper transistor devices (e.g., third and fourth upper transistor devices $Q_{upper3}$, $Q_{upper4}$) and a second set of lower transistor devices (e.g., lower transistor devices $Q_{lower3}$, $Q_{lower4}$) are located on a second side (e.g., a bottom side) of the PCB. First and second supply decoupling elements 1301, 1302 are also located on the first side of the PCB, and third and fourth supply decoupling elements 1303, 1304 are located on the second side of the PCB.

In circuit 1300, paralleled upper transistor devices $Q_{upper1}$, $Q_{upper2}$, $Q_{upper3}$, $Q_{upper4}$ have their respective gates commonly coupled to upper gate driver transfer line 1305 using an X-structure connection, and paralleled lower transistor devices $Q_{lower1}$, $Q_{lower2}$, $Q_{lower3}$, $Q_{lower4}$ have their respective gates commonly coupled to lower gate driver transfer line 1307 using an X-structure connection.

FIGS. 18A and 18B show two different approaches to provide electrically close common connections between paralleled transistor devices. FIG. 18A illustrates one example layout for paralleled transistor devices in a circuit 1200, which may be, for example, a switching circuit. Circuit 1400 includes parallel upper transistor devices $Q_{upper1}$, $Q_{upper2}$ and parallel lower transistor devices $Q_{lower1}$ and $Q_{lower2}$. In FIG. 18A, each of first upper transistor device $Q_{upper1}$ and first lower transistor device $Q_{lower1}$ includes two shorter sides a, c, and two longer sides b, d. Each of second upper transistor device $Q_{upper2}$ and second lower transistor device $Q_{lower2}$ includes two shorter sides e, g, and two longer sides f, h. For example, transistor devices $Q_{upper1}$, $Q_{upper2}$, $Q_{lower1}$, and $Q_{lower2}$ may have a quadrangular or substantially rectangular footprint. It should be understood that, while other embodiments may depict transistor devices having shorter and/or longer sides, such as rectangular-shaped transistor devices, these devices are not drawn to scale and are not intended to be limited to any particular shape or footprint.

To further reduce the effects of common source inductance on operation of the circuit 1400, respective shorter sides c, e of upper transistor devices $Q_{upper1}$ and $Q_{upper2}$ are aligned, and respective shorter sides c, e of lower transistor devices $Q_{lower1}$ and $Q_{lower2}$ are aligned, thereby forming the longest (in relation to the gate current path) and narrowest (in relation to the drain source current path) layout structure possible. Such an arrangement results in the drain source loop of circuit 1400 having very low impedance in relation to the gate source loop. This ensures that high transient currents flow in a predictable manner, and do not creep into and corrupt alternative paths, such as the gate source circuit.

Also in circuit 1400, each transistor device $Q_{upper1}$, $Q_{upper2}$, $Q_{lower1}$, and $Q_{lower2}$ includes a respective gate connection 1430, 1440, 1470, 1480, each of which may be, for example, conductive gate pads. In circuit 1400, upper switch gate connections 1430, 1440 are arranged at opposing corners of adjacent shorter sides c, e of the respective footprints of transistor devices $Q_{upper1}$, $Q_{upper2}$. Lower switch gate connections 1470, 1480 are arranged at opposing corners of adjacent shorter sides c, e of the respective footprints of transistor devices $Q_{lower1}$, $Q_{lower2}$. It should be understood, however, that upper switch gate connections 1430, 1440 and lower switch gate connections 1470, 1480 need not be arranged at opposing corners, however. Indeed, future devices may include gate connections in a center of respective footprints of transistor devices. Such centered gates, used in the configuration of circuit 1400, may further reduce common source inductance, and furthermore a centered gate may include source connections on either side of the gate pad, thereby further reducing inductance. Arranging the gate connections of paralleled transistor devices on adjacent sides provides for use of a starred electrical connection 1435 between first upper switch gate connector 1430 and second upper switch gate connector 1440, where the starred connection includes a shared common node electrically connecting first upper switch gate connector 1430 and second upper switch gate connector 1440 to gate driver circuitry (e.g., to a gate driver voltage source). A starred electrical connection 1475 is also established between first lower switch gate connector 1470 and second lower switch gate connector 1480, including a shared common node electrically connecting first lower switch gate connector 1470 and second lower switch gate connector 1480 to gate driver circuitry. The starred pattern helps to reduce the effects of the remaining inductance from the star point to the gate pad, due to the geometric symmetry of the gate connections.

While the long narrow structure of circuit 1400 in FIG. 18A results in a drain source loop having very low impedance in relation to the gate loop, it also creates high inductance in circuit 1400. FIG. 18B, on the other hand, illustrates another example layout for paralleled transistor devices in a circuit 1500, which may be, for example, a switching circuit. In circuit 1500, parallel transistors $Q_{upper1}$ and $Q_{upper2}$ are arranged with a broad side b of $Q_{upper1}$ facing a broad side h of $Q_{upper2}$. Parallel transistors $Q_{lower1}$ and $Q_{lower2}$ are arranged with a broad side d of $Q_{lower1}$ facing a broad side f of $Q_{lower2}$. This short wide structure, where the gates 1530, 1540 of paralleled upper transistors $Q_{upper1}$ and $Q_{upper2}$ are coupled using a first H-structure configuration 1535, and the gates 1570, 1580 of paralleled upper transistors $Q_{lower1}$ and $Q_{lower2}$ are coupled using a second H-structure configuration 1575, provides a lower inter-device source inductance than circuit 1400 in FIG. 18A.

FIG. 19 illustrates a cross-sectional view of a portion 1600 of a printed circuit board (PCB). PCB portion 1600 includes a top side, as well as multiple interior layers including layers 1-4. Portion 1600 also includes an upper transistor device 910 and a lower transistor device 920 formed on a top side of the PCB.

As shown in FIG. 19, connections to upper and lower transistor devices 910, 920 can be assigned to different layers within PCB portion 1600. Doing so can reduce capacitive coupling between the elements, such as an undesirable capacitive coupling on gate transmission lines. For upper transistor device 910, PCB portion 1600 includes a positive supply voltage connection 912 in a first layer, a first output/gate return connection 914 in a second layer, a gate connection 916 in a third layer, and a second output/gate return connection 918 in a fourth layer. For lower transistor device 920, PCB portion 1600 includes a first negative supply voltage connection 922 in a first layer, a gate connection 924 in a second layer, a second negative supply/gate return connection 926 in a third layer, and an output/gate return connection 928 in a fourth layer. In one embodiment, for upper transistor device 910, positive supply voltage connection 912 may be connected to a drain of device 910, and first output/gate return connection 914 and second output/gate return connection 918 may be connected to a source of device 910. For lower transistor device 920, first negative supply voltage connection 922 may be connected to a source of device 920, and second negative supply/gate return connection 926 and output/gate return connection 928 may be connected to a source of device 920.

Gate connection 916 for upper transistor device 910 is located between two electrically "quiet" layers, e.g., layers 2 and 4, upon which first and second output/gate return connections 914, 918 are formed. Electrically "quiet" refers to the relatively low voltage difference between two layers with respect to each other. This can include dv/dt as a consequence. Gate connection 924 for lower transistor device 920 is also located between two electrically "quiet" layers, e.g., layers 1 and 3, upon which first and second negative supply connections 922, 924 are formed.

FIG. 20 illustrates a cross-sectional view of a portion 1700 of a dual-component-sided printed circuit board (PCB). PCB portion 1700 includes a top side, a bottom side, and multiple interior layers including layers 1-8. Portion 1700 also includes an upper transistor device 930 formed on the top side of the PCB and a lower transistor device 966 formed on the bottom side of the PCB.

Connections to upper and lower transistor devices 930, 966 can be assigned to different layers within PCB portion 1700, to reduce capacitive coupling between the elements. For upper transistor device 930, a positive supply connection 932 can be formed in a first layer, a first output/gate return connection 934 can be formed in a second layer, a first gate connection 936 can be formed in a third layer, second and third output/gate return connections 938, 940 can be formed in a fourth layer and a fifth layer, respectively, a second gate connection 942 can be formed in a sixth layer, a fourth output/gate return connection 944 can be formed in a seventh layer, and a second positive supply connection 946 can be formed in an eighth layer. For lower transistor device 936, a negative supply connection 950 can be formed in the first layer, a first gate connection 952 can be formed in the second layer, a first negative supply/gate return connection 954 can be formed in the third layer, first and second output/gate return connections 956, 958 can be formed in the fourth and fifth layers, respectively, a second negative supply/gate return connection 960 can be formed in the sixth layer, a second gate connection 962 can be formed in the seventh layer, and a second negative supply connection 964 can be formed in the eighth layer.

In PCB portion 1700, first gate connection 936 for upper transistor device 930 is located between two electrically "quiet" layers, e.g., layers 2 and 4, upon which first and second output/gate return connections 934, 938 are formed, and second gate connection 942 is located between two electrically "quiet" layers, e.g., layers 5 and 7, upon which output/gate return connections 940 and 944 are formed. First gate connection 952 for lower transistor device 966 is also located between two electrically "quiet" layers, e.g., layers 1 and 3, upon which first negative supply connections 950 and first negative supply/gate return connection 954 are formed, and second gate connection 962 is located between electrically "quiet" layers, e.g., layers 6 and 8, upon which second negative supply/gate return connection 960 and second negative supply connection 964 are formed.

Figure 21:
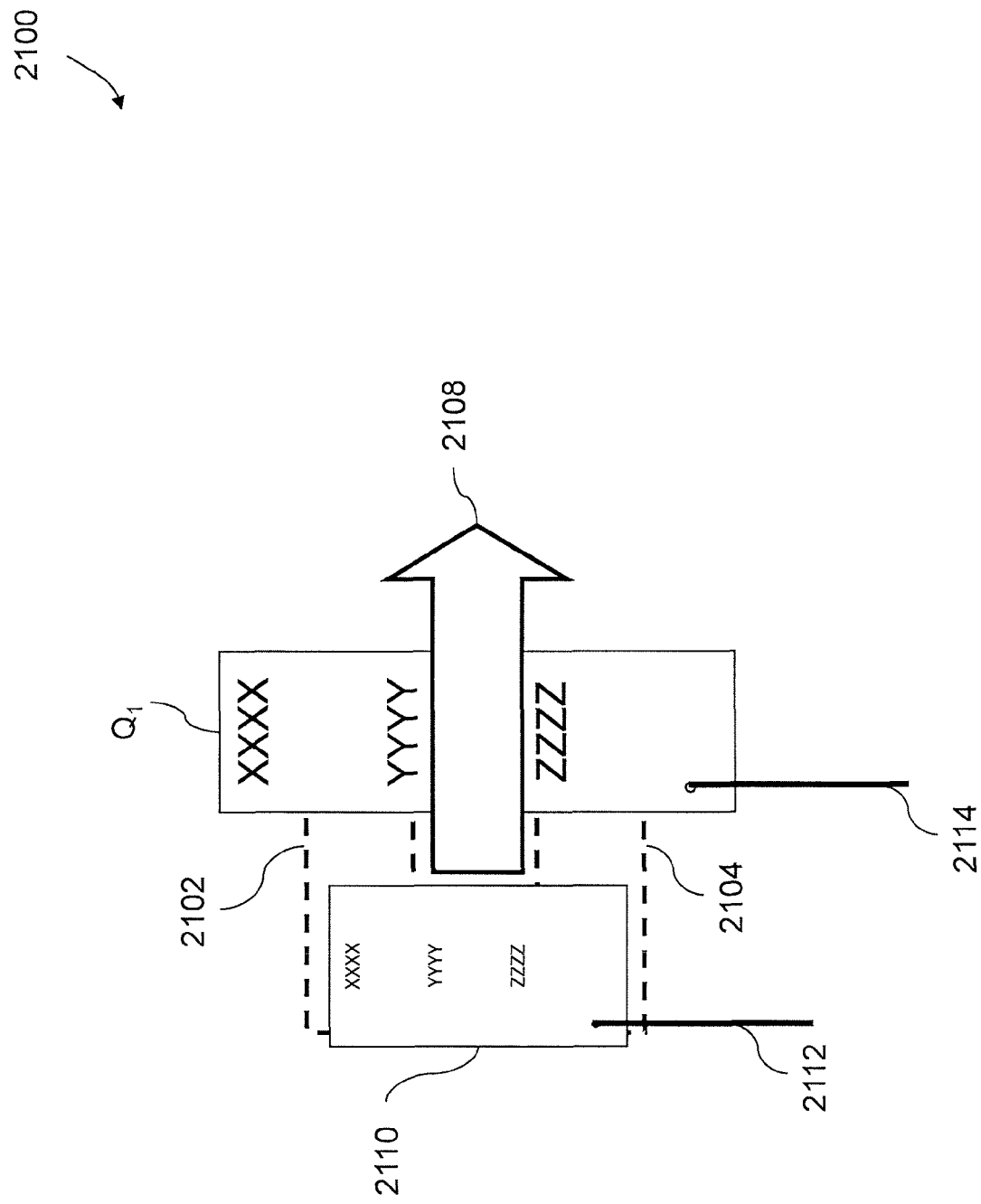
FIG. 21 shows a layout of a semiconductor converter circuit, in accordance with embodiments described herein.

While certain embodiments described above have discussed paralleled transistor devices in connection with switching applications, other uses are also within the scope of this disclosure, including in converter circuits. For example, by way of reference, FIG. 21 illustrates a layout design for a circuit 2100 including a single transistor device $Q_1$. Circuit 2100 may be used, for example, in a converter circuit, such as a buck converter. Transistor device $Q_1$ may be, for example, a GaN transistor device formed on a top side of a PCB, and acts as a synchronous rectifier for a buck converter formed from circuit 2100. Circuit 2100 outputs an output current path 2208 widthwise to transistor device $Q_1$. Circuit 2100 also includes first and second supply decoupling elements 2102, 2104, which may be formed on a bottom side of the PCB. Circuit 2100 also includes an input switch 2110, which may be, for example, another transistor device such as a GaN or MOSFET transistor device, and an input switch gate driver line 2112. Transistor device $Q_1$, serving as a synchronous rectifier for circuit 2100, is controlled by a gate transfer control line 2114. In order to increase the circuit characteristics of converter circuits (e.g., increasing current-handling capabilities and/or heat loss distribution), paralleling of multiple transistor devices may be desired.

Figure 22:
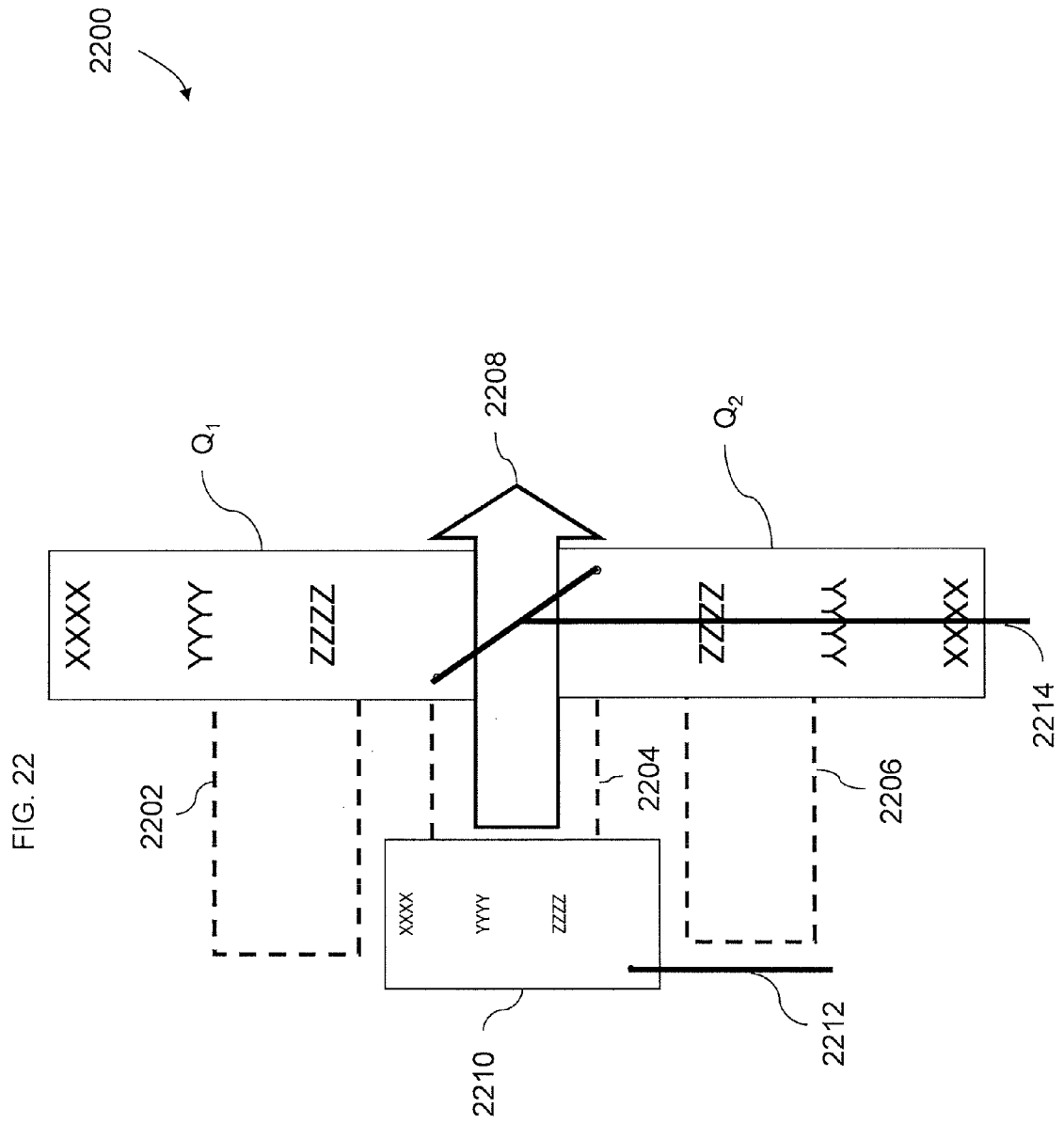
FIG. 22 shows a layout of a semiconductor converter circuit, in accordance with embodiments described herein.

FIG. 22 shows a layout design for a circuit 2200 including paralleled transistor devices $Q_1$ and $Q_2$. Circuit 2200 may be used, for example, as a buck converter. Transistor devices $Q_1$ and $Q_2$ may be, for example, GaN transistor devices formed on a top side of a PCB, and connected in parallel act as a synchronous rectifier for a buck converter formed by circuit 2200. Circuit 2200 also includes first, second, and third supply decoupling elements 2202, 2204, 2206, which may be formed on a bottom side of the PCB. Circuit 2200 also includes an input switch 2210, which may be, for example, another transistor device such as a GaN or MOSFET transistor device, controlled by an input switch gate driver line 2212. Transistor devices $Q_1$ and $Q_2$, serving as a synchronous rectifier for circuit 2200, are controlled by a gate transfer control line 2214 in an X-structure configuration. Paralleled transistor devices $Q_1$ and $Q_2$ are arranged vertically lengthwise to one another, and an output current path 2208 of circuit 2200 flows widthwise to the paralleled transistor devices $Q_1$ and $Q_2$ of circuit 2200.

Figure 23:
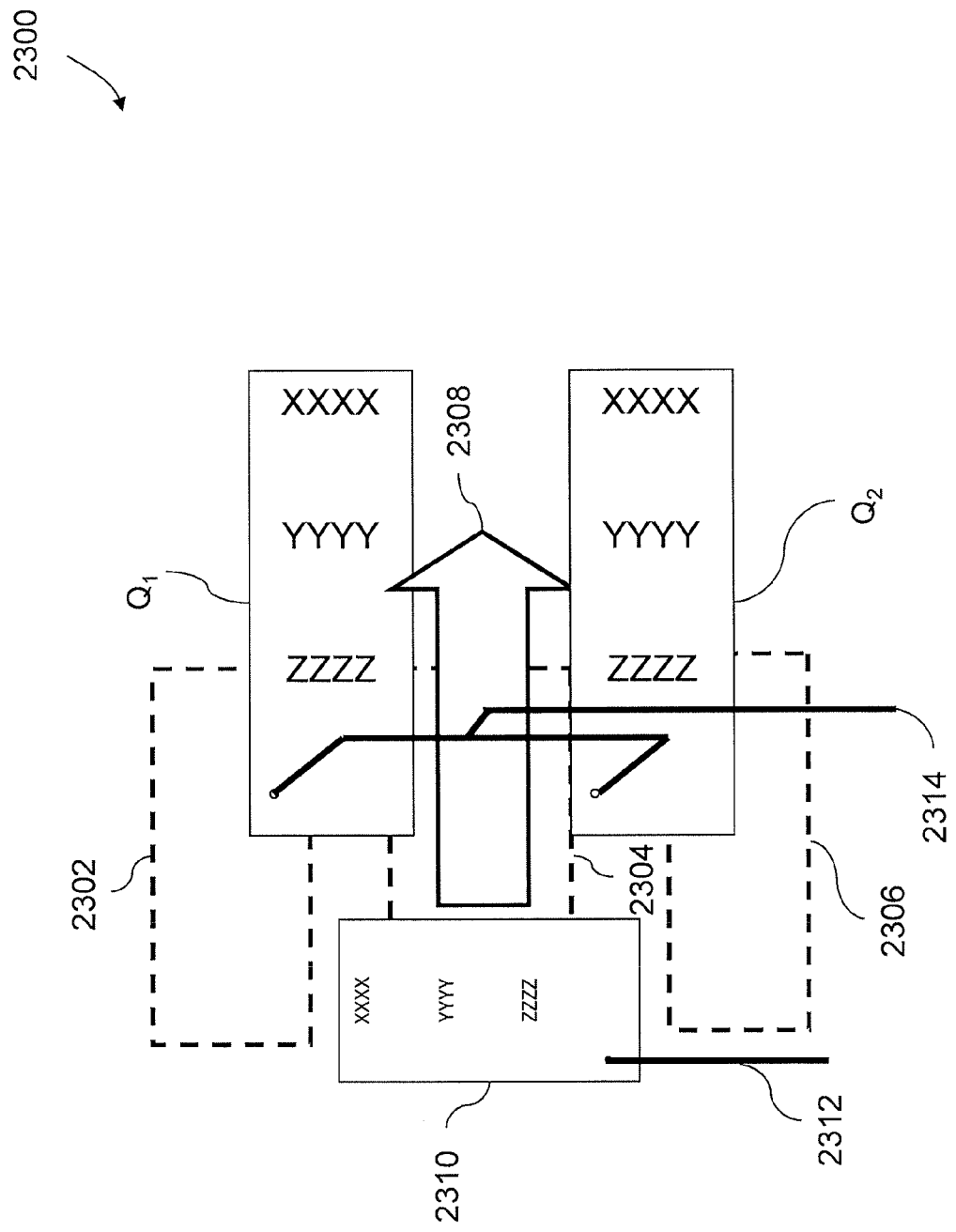
FIG. 23 shows a layout of a semiconductor converter circuit, in accordance with embodiments described herein.

FIG. 23 shows another layout design for circuit 2300 including paralleled transistor devices $Q_1$ and $Q_2$, which may be used as part of a buck converter. Similar to circuit 2200 of FIG. 22, circuit 2300 includes transistor devices $Q_1$ and $Q_2$ that, in parallel, act as a synchronous rectifier for a buck converter formed by circuit 2300. Transistor devices $Q_1$ and $Q_2$ may be, for example, GaN transistor devices formed on a top side of a PCB. In contrast to circuit 2200, however, transistor devices transistor devices $Q_1$ and $Q_2$ of circuit 2300 are arranged vertically widthwise to one another, and are controlled by a gate transfer control line 2314 in an H-structure configuration. Circuit 2300 also includes first, second, and third supply decoupling elements 2302, 2304, 2306, which may be formed on a bottom side of the PCB. Circuit 2300 also includes an input switch 2310, which may be, for example, another transistor device such as a GaN or MOSFET transistor device, controlled by an input switch gate driver line 2312.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A circuit for reducing common source inductance between paralleled transistors, comprising:
   a first transistor;
   a second transistor connected in parallel with the first transistor;
   a third transistor;
   a fourth transistor connected in parallel with the third transistor;
   wherein a first pair of the four transistors are arranged such that their respective gates are oriented adjacent from each other and a second pair of the four transistors are arranged such that their respective gates are oriented adjacent from each other;
   a first gate transfer line electrically coupling the gates of the first pair of transistors, the first gate transfer line running perpendicular to the output current path of the circuit; and
   a second gate transfer line electrically coupling the gates of the second pair of transistors, the second gate transfer line running perpendicular to the output current path,
   wherein the arrangement and electrical coupling of the gates of the transistors provides a perpendicular spatial separation between the output current path and common source induction current path, the spatial separation decoupling the common source induction current path from the output current path, thereby reducing the common source inductance between the transistors.

2. The circuit of claim 1, wherein the first and second transistors are gallium nitride transistors.

3. The circuit of claim 1, wherein the first and second transistors are silicon transistors.

4. The circuit of claim 1, wherein the output current path is perpendicular to a current path of the common source inductance of the circuit.

5. The circuit of claim 1, wherein the first and second transistors experience a substantially equal voltage shift at a common gate connection as a result of a shift in an output current of the circuit.

6. The circuit of claim 1, wherein the first and second transistors are arranged widthwise to one another with the same orientation.

7. The circuit of claim 1, wherein the first and second transistors are arranged lengthwise to one another with opposing orientations.

8. The circuit of claim 1, wherein the third and fourth transistors have a common gate connection.

9. The circuit of claim 8, wherein the first and second transistors are arranged widthwise to one another, and the third and fourth transistors are arranged widthwise to one another.

10. The circuit of claim 1, wherein the first gate transfer line is coupled to the gates of the first and second transistors in a T structure configuration.

11. The circuit of claim 1, wherein the first gate transfer line is coupled to the gates of the first and second transistors in an H structure configuration.

12. The circuit of claim 1, wherein the first gate transfer line is coupled to the gates of the first and second transistors in an S structure configuration.

13. The circuit of claim 1, wherein a first distance from the gate driver transfer line to an output node of the circuit is greater than a second distance spanning the combined widths of the first and second transistors.

14. The circuit of claim 1, wherein the output current path comprises a first supply-to-load current path from the first transistor to the output node and a second supply-to-load current path from the second transistor to the output node.

15. The circuit of claim 8, wherein the output current path comprises:
   a first supply-to-load current path from the first transistor to the output node;
   a second supply-to-load current path from the second transistor to the output node;
   a first return-to-load current path from the third transistor to the output node; and
   a second supply-to-load current path from the fourth transistor to the output node.

16. The circuit of claim 1, wherein a parasitic inductance at a source of the first transistor has substantially the same magnitude as a parasitic inductance at a source of the second transistor.

17. The circuit of claim 16, wherein a voltage resulting from the output current on the parasitic inductance at the source of the first transistor has a substantially equal magnitude as a voltage resulting from the output current on the parasitic inductance at the source of the second transistor.

18. The circuit of claim 1, further comprising a decoupling element for decoupling the circuit from a power supply.

19. The circuit of claim 18, wherein the decoupling element is a capacitor.

20. The circuit of claim 1, wherein the first and second transistors are arranged such that a distance between respective gates is less than three times the distance of the smallest physical dimension of the transistor devices.

21. The circuit of claim 1, wherein the first and second transistors include traces connected to the respective gate connections that are wider than the width of the gate connections.

22. A switching circuit for reducing common source inductance between paralleled transistors, comprising:
- a plurality of upper transistors, each of said upper transistors comprising a respective source connection and drain connection and a common gate connection and at least two of the plurality of upper transistors being connected in parallel;
- a plurality of lower transistors, each of said lower transistors comprising a respective source connection and drain connection and a common gate connection and at least two of the plurality of lower transistors being connected in parallel;
- an output current node for outputting an output current of the switching circuit;
- an upper switch gate connection line electrically connected to the common gate connection of the plurality of upper transistors wherein the upper switch gate connection line runs perpendicular to the output current;
- a lower switch gate connection line electrically connected to the common gate connection of the plurality of lower transistors wherein the lower switch gate connection line runs perpendicular to the output current; and
- wherein the upper transistors are arranged such that respective gates of the upper transistors are adjacent to each other and the lower transistors are arranged such that respective gates of the lower transistors are adjacent to each other,
- wherein the arrangement and electrical connection of the gates of the transistors provides a perpendicular spatial separation between the output current and common source induction current, the spatial separation decoupling the common source induction current from the output current, thereby reducing the common source inductance between the transistors.

23. The switching circuit of claim 22, wherein at least one of the upper or lower pluralities of transistors is a gallium nitride transistor.

24. The switching circuit of claim 22, wherein the upper transistors are configured to experience a substantially equal voltage shift at the common gate connection of the upper transistors as a result of a current shift, and the lower transistors are configured to experience a substantially equal voltage shift at the common gate connection of the lower transistors as a result of a current shift.

25. The switching circuit of claim 22, wherein the circuit has an output current path with spatial separation from an inductance on the respective common gate connections of the upper and lower pluralities of transistors.

26. The switching circuit of claim 22, wherein the plurality of upper transistors includes a first transistor and a second transistor arranged in a same orientation and connected in parallel, and wherein the plurality of lower transistors includes a third transistor and a fourth transistor arranged in a same orientation and connected in parallel.

27. The switching circuit of claim 22, wherein the plurality of upper transistors includes a first transistor and a second transistor arranged in opposite orientations and connected in parallel, and wherein the plurality of lower transistors includes a third transistor and a fourth transistor arranged in opposite orientations and connected in parallel.

28. The switching circuit of claim 22, wherein the plurality of upper transistors includes a first transistor, a second transistor, and a third transistor connected at a common gate, and wherein the plurality of lower transistors includes a fourth transistor, a fifth transistor, and a sixth transistor arranged connected in parallel.

29. The switching circuit of claim 28, wherein the plurality of upper transistors further comprises a seventh transistor connected in parallel to the first, second, and third transistors, and wherein the plurality of lower switches further comprises an eighth transistor.

30. The switching circuit of claim 22, wherein the switching circuit is formed on a printed circuit board.

31. The switching circuit of claim 30, wherein a first set of the plurality of upper transistors is located on a first surface of the printed circuit board, and a second set of the plurality of upper transistors is located on a second surface of the printed circuit board.

32. The switching circuit of claim 30, wherein a first set of the plurality of lower transistors is located on a first surface of the printed circuit board, and a second set of the plurality of lower transistors is located on a second surface of the printed circuit board.

33. The switching circuit of claim 30, wherein the printed circuit board comprises a top surface, a bottom surface, and a plurality of internal layers.

34. The switching circuit of claim 33, wherein the upper switch gate connection line is formed between two electrically quiet internal layers.

35. The switching circuit of claim 33, wherein the lower switch gate connection line is formed between two electrically quiet internal layers.

36. The switching circuit of claim 22, further comprising at least one supply decoupling element.

37. The switching circuit of claim 36, wherein the supply decoupling element is a capacitor.

38. The switching circuit of claim 22, wherein the circuit is a converter.

39. The switching circuit of claim 22, wherein the circuit is an RF amplifier.

40. The switching circuit of claim 22, wherein the transistors are arranged such that a distance between adjacent gates is less than three times the distance of the smallest physical dimension of the transistor devices.

41. A method of forming a switching device with reduced common source inductance between paralleled transistors, said method comprising:
- forming a first transistor having a first source, drain, and gate and a second transistor having a second source, drain, and gate on a printed circuit board;
- forming a common gate connection and a common source connection for the first transistor and the second transistor,
- forming a third transistor on the printed circuit board having a third gate;
- forming a fourth transistor in parallel with the third transistor on the printed circuit board, the fourth transistor having a fourth gate;
- wherein a first pair of the four transistors are arranged such that their respective gates are adjacent to one another and a second pair of the four transistors are arranged such that their respective gates are adjacent to one another;

electrically coupling the respective gates of the first pair of transistors with a first gate connection driver line that runs perpendicular to an output current direction of the switching device; and electrically coupling the respective gates of the second pair of transistors with a second gate connection driver line that runs perpendicular to the output current direction, wherein the arrangement and electrical coupling of the gates of the transistors provides a perpendicular spatial separation between the output current direction and common source induction current direction, the spatial separation decoupling the common source induction current from the output current, thereby reducing the common source inductance between the transistors.

42. The method of claim 41, wherein the first transistor and the second transistor are formed on a surface of a printed circuit board.

43. The method of claim 41, further comprising:
forming a gate connection driver line electrically connected to the common gate connection of the first and second transistor.

44. The method of claim 41, wherein the third transistor and the fourth transistor have forming a common gate connection and a common source connection.

45. The method of claim 44, wherein
the first gate connection driver line electrically connects to the common gate connection of the first and second transistors; and
the second gate connection driver line electrically connects to the common gate connection of the third and fourth transistors.

46. The method of claim 41, wherein the transistors are arranged such that a distance between adjacent gates is less than three times the distance of the smallest physical dimension of the transistor devices.

* * * * *